US012805283B2

(12) United States Patent
Chen et al.

(10) Patent No.: US 12,805,283 B2
(45) Date of Patent: Nov. 17, 2026

(54) BACKSIDE CONTACT AND METAL OVER DIFFUSION

(71) Applicant: Taiwan Semiconductor Manufacturing Company, Ltd., Hsinchu (TW)

(72) Inventors: Yi-Yi Chen, Hsinchu (TW); Chi-Yu Lu, New Taipei City (TW); Chih-Liang Chen, Hsinchu (TW); Li-Chun Tien, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 617 days.

(21) Appl. No.: 18/311,773

(22) Filed: Jul. 25, 2023

(65) Prior Publication Data

US 2025/0038070 A1 Jan. 30, 2025

(51) Int. Cl.

*H10W 20/20* (2026.01)
*H10D 30/01* (2025.01)
*H10D 30/63* (2025.01)
*H10D 62/13* (2025.01)
*H10D 64/23* (2025.01)
*H10D 84/01* (2025.01)
*H10D 84/03* (2025.01)
*H10D 84/85* (2025.01)

(52) U.S. Cl.

CPC .......... *H10W 20/20* (2026.01); *H10D 30/025* (2025.01); *H10D 30/63* (2025.01); *H10D 62/151* (2025.01); *H10D 64/252* (2025.01); *H10D 84/017* (2025.01); *H10D 84/0186* (2025.01); *H10D 84/038* (2025.01); *H10D 84/85* (2025.01)

(58) Field of Classification Search

None

See application file for complete search history.

(56) References Cited

U.S. PATENT DOCUMENTS

| | | | | |
|---|---|---|---|---|
| 10,985,064 | B2 * | 4/2021 | Zhang | H10D 30/6728 |
| 2007/0146008 | A1 * | 6/2007 | Tak | H03F 3/195<br>257/E21.41 |
| 2015/0370950 | A1 * | 12/2015 | Kawa | B82Y 10/00<br>716/119 |
| 2018/0122793 | A1 * | 5/2018 | Moroz | G06F 30/392 |
| 2023/0067311 | A1 | 3/2023 | Lai et al. | |

FOREIGN PATENT DOCUMENTS

| | | | |
|---|---|---|---|
| TW | 202310192 | A | 3/2023 |
| TW | 202318645 | A | 5/2023 |

* cited by examiner

*Primary Examiner* — Cory W Eskridge

(74) *Attorney, Agent, or Firm* — Merchant & Gould P.C.

(57) ABSTRACT

A device including a first vertical field effect transistor having a first drain/source region and a second drain/source region, and a second vertical field effect transistor having a third drain/source region and a fourth drain/source region. The device including a first power contact situated on a frontside of the device and coupled to the first drain/source region, a second power contact situated on the frontside of the device and coupled to the third drain/source region, and a contact situated on a backside of the device and coupled to the second drain/source region and to the fourth drain/source region.

20 Claims, 28 Drawing Sheets

BACKSIDE CONTACT AND METAL OVER DIFFUSION

BACKGROUND

Typically, vertical field-effect transistor (VFET) devices include power contacts and reference contacts situated on the backside of the VFET device, and input contacts and output contacts situated on the frontside of the VFET device. In this situation, vertical metal structures can be used to connect the backside power contacts and the backside reference contacts to the frontside of the device, and/or to connect the frontside input contacts and the frontside output contacts to the backside of the device. However, each vertical metal structure increases the area of the VFET device by one contacted poly pitch (CPP).

Also, each of the VFET devices usually include four to six horizontal track routing channels for crossing the device or cell. But in some circuits, three or more of these horizontal track routing channels may be blocked by frontside input contacts and frontside output contacts that use the horizontal track routing channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
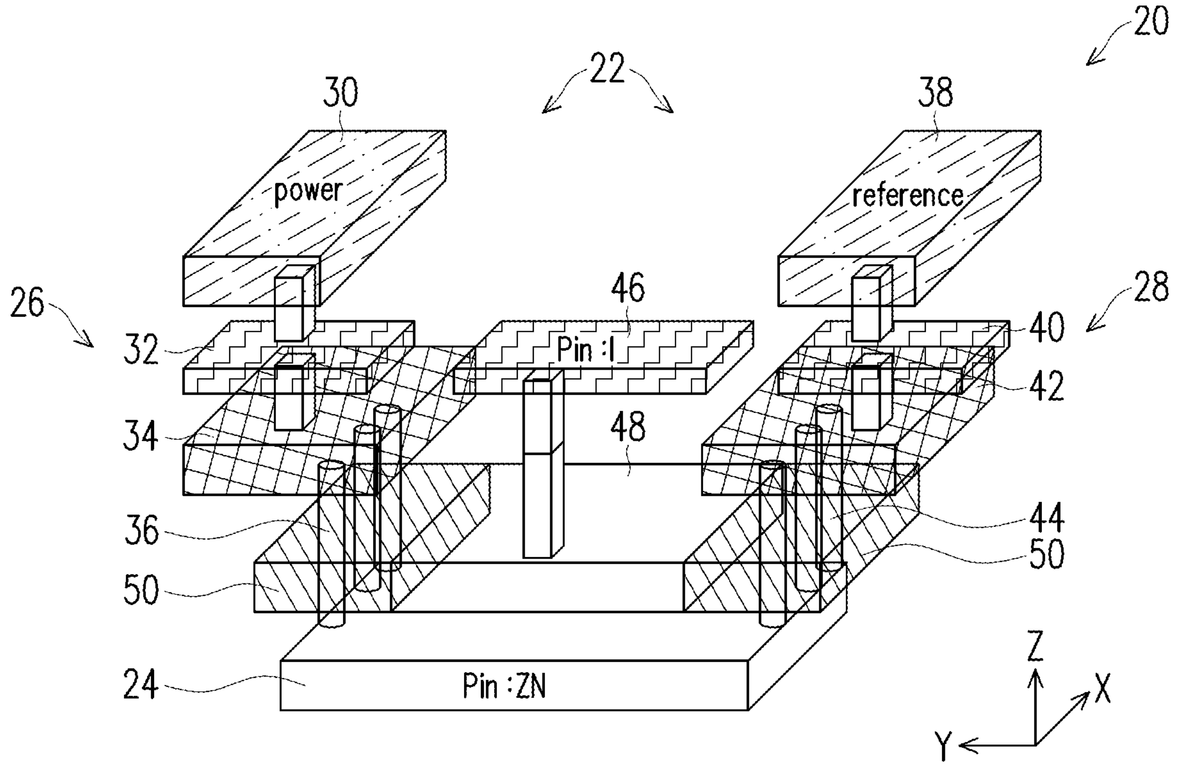
FIG. 1 is a diagram schematically illustrating a VFET device that includes frontside power contacts and a backside contact, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments include VFET devices or cells that include layouts and structures for reducing the area of the VFET devices. These layouts and structures include frontside power contacts, backside contacts or pins, two-dimensional backside contacts, and two-dimensional metal over diffusion (MD) layers. In some embodiments, the frontside power contacts includes partial frontside power contacts. In some embodiments, the frontside power contacts includes a power voltage contact and/or a power reference contact, such as ground. In some embodiments, the backside contacts are connected using an automatic place and route (APR) routine. In some embodiments, at least one of the backside contacts is connected to the frontside using a filler structure that extends between the backside contact and a frontside metal layer of the VFET device.

In some embodiments, a VFET device includes a first VFET having a first drain/source region and a second drain/source region, and a second VFET having a third drain/source region and a fourth drain/source region. The VFET device includes a first power contact, such as a power voltage contact, situated on a frontside of the device and coupled to the first drain/source region and a second power contact, such as a reference contact, situated on the frontside of the device and coupled to the third drain/source region. The VFET device further includes a backside contact situated on a backside of the device and coupled to the second drain/source region and to the fourth drain/source region. In some embodiments, the two-dimensional backside contacts and/or the two-dimensional MD layers connect multiple transistors, such as VFETs, together.

Advantages of the frontside power contacts, the backside contacts, the two-dimensional backside contacts, and the two-dimensional MD layers include reducing the area of VFET devices, increasing gate density, and reducing metal layer coupling.

FIG. 1 is a diagram schematically illustrating a VFET device 20 that includes frontside power contacts 22 and a backside contact 24, in accordance with some embodiments. In the frontside metal layers of the VFET device 20, first metal layer M0 extends in the y-direction and second metal layer M1 extends in the x-direction.

The VFET device 20 is an inverter that includes a first VFET 26 and a second VFET 28 connected by the backside contact 24, which is the output pin ZN. The gates of the first VFET 26 and the second VFET 28 are connected at the input pin I. In some embodiments, the first VFET 26 is a p-channel metal-oxide semiconductor field-effect transistor (MOSFET), also referred to as a PMOS transistor, and the second VFET 28 is an n-channel MOSFET, also referred to as an NMOS transistor. In some embodiments, the first VFET 26 and the second VFET 28 are formed over a substrate (not shown for clarity in FIG. 1).

The first VFET 26 includes a frontside voltage contact 30 in second metal layer M1 connected through a via V0 to first metal layer M0 32 that is connected through a via over diffusion VD to the MD layer 34 that is in contact with a source region in the oxide diffusion (OD) wires 36 of the first VFET 26. The OD wires 36 define the active areas of the first VFET 26 including the source, drain, and channel regions of the first VFET 26. The backside contact 24 is connected to the drain of the OD wires 36.

The second VFET 28 includes a frontside reference contact 38 in second metal layer M1 connected through a via V0 to first metal layer M0 40 that is connected through a via over diffusion VD to the MD layer 42 that is in contact with a source in the OD wires 44 of the second VFET 28. The OD wires 44 define the active areas for the second VFET 28 including the source, drain, and channel regions of the second VFET 28. The backside contact 24 is connected to the drain of the OD wires 44.

The gates of the first VFET 26 and the second VFET 28 include a frontside input contact 46, input pin I, in first metal layer M0 that is connected through a via over gate VG and a via material MP2 to a gate MP 48 that is connected to gate material MG 50 that surrounds the OD wires 36 and 44. In some embodiments, the via material MP2 includes polycrystalline silicon and, in some embodiments, the gate MP 48 includes polycrystalline silicon.

With frontside power contacts 22, vertical metal structures are not used to connect backside power contacts to the frontside of the VFET device 20. Also, the backside contact 24 is an output pin ZN that can be connected to other backside contacts and/or to other circuits. In some embodiments, the backside contact 24 is connected to the frontside using a filler structure that extends between the backside contact 24 and a frontside metal layer, such as first metal layer M0. In some embodiments, the two-dimensional backside contact 24 and/or the two-dimensional MD layers 34 and 42 are connected to multiple transistors, connecting the multiple transistors together.

Figure 2:
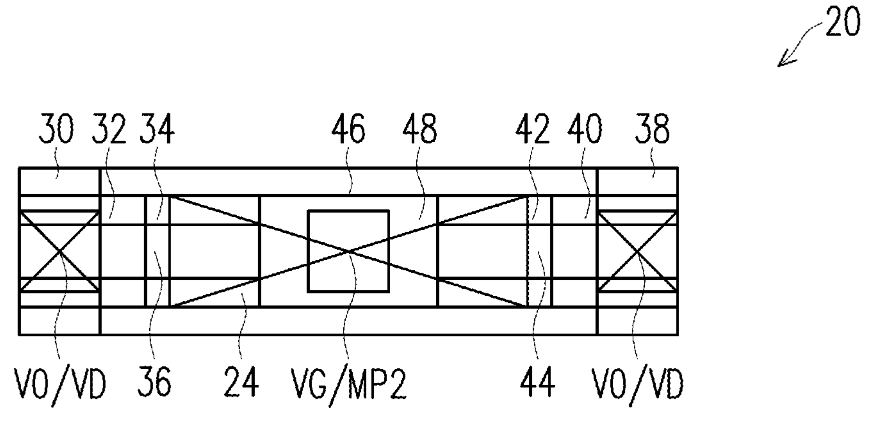
FIG. 2 is a diagram schematically illustrating a two-dimensional view of the VFET device of FIG. 1, in accordance with some embodiments.

FIG. 2 is a diagram schematically illustrating a two-dimensional view of the VFET device 20, in accordance with some embodiments. The two-dimensional view of the VFET device 20 includes different layers of the VFET device 20 in one stripe.

The two-dimensional view of the VFET device 20 includes the frontside voltage contact 30 in second metal layer M1 connected to the first metal layer 32 that is connected to the MD layer 34 that is in contact with the source region of the OD wires 36, where the drain region of the OD wires 36 is connected to the backside contact 24.

Also, the two-dimensional view of the VFET device 20 includes the frontside reference contact 38 in second metal layer M1 connected to the first metal layer M0 40 that is connected to the MD layer 42 that is in contact with the source region of the OD wires 44, where the drain region of the OD wires 44 is connected to the backside contact 24.

In addition, the two-dimensional view of the VFET device 20 includes the frontside input contact 46, input pin I, in first metal layer M0 that is connected to the gate MP 48 that is connected to gate material MG 50 that surrounds the OD wires 36 and 44.

Figure 3:
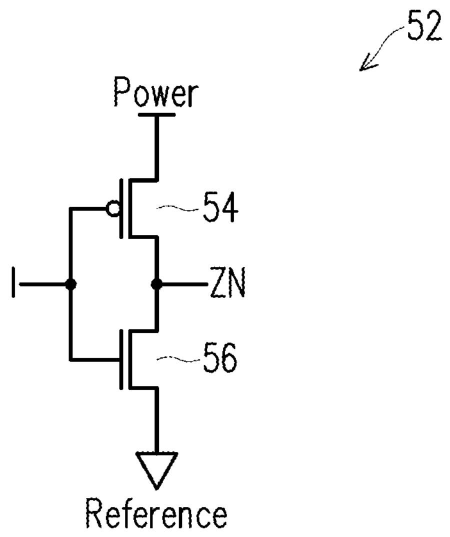
FIG. 3 is a diagram schematically illustrating a complementary metal-oxide semiconductor (CMOS) inverter that is like the VFET device of FIGS. 1 and 2, in accordance with some embodiments.

FIG. 3 is a diagram schematically illustrating an inverter 52 that is like the VFET device 20, in accordance with some embodiments. The inverter 52 includes a PMOS transistor 54 and an NMOS transistor 56. The VFET device 20 is like the inverter 52, such that the first VFET 26 is like the PMOS transistor 54 and the second VFET 28 is like the NMOS transistor 56.

One drain/source region of the PMOS transistor 54 is connected to a power voltage contact, such as frontside voltage contact 30, and the other drain/source region of the PMOS transistor 54 is connected to one drain/source region of the NMOS transistor 56 at the output ZN. The other drain/source region of the NMOS transistor 56 is connected to a reference contact, such as frontside reference contact 38. The gates of the PMOS transistor 54 and the NMOS transistor 56 are connected at the input pin I.

Figure 4:
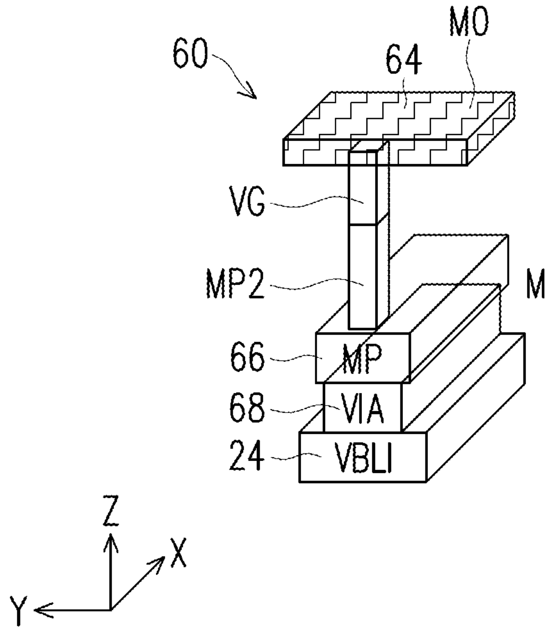
FIG. 4 is a diagram schematically illustrating a filler structure that includes first metal layer M0 connected to gate material MP through a via over gate (VG) and a via material MP2, in accordance with some embodiments.
Figure 5:
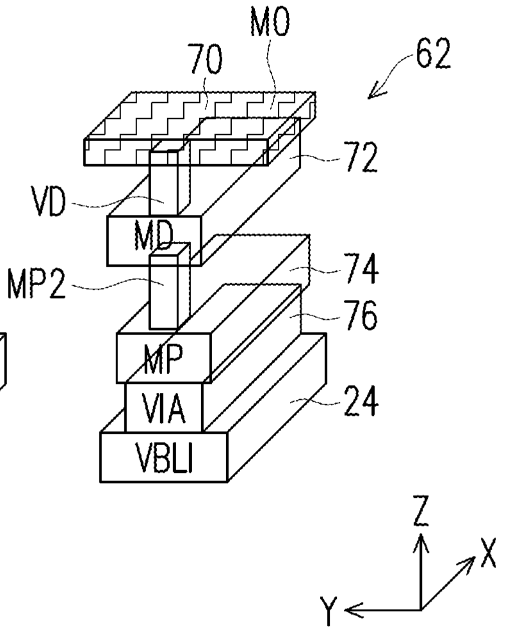
FIG. 5 is a diagram schematically illustrating a filler structure that includes first metal layer M0 connected to a metal-over-diffusion (MD) layer that is connected to gate material MP, in accordance with some embodiments.
Figure 6:
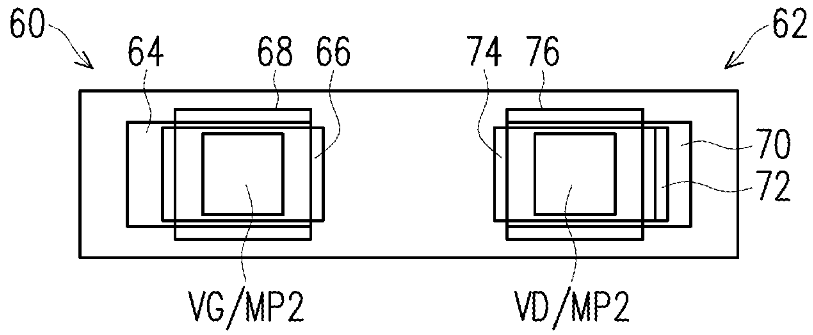
FIG. 6 is a diagram schematically illustrating a two-dimensional view of the filler structures of FIGS. 4 and 5, in accordance with some embodiments.

FIGS. 4-6 are diagrams schematically illustrating filler structures 60 and 62 that can be used to connect the backside contact 24 to first metal layer M0, in accordance with some embodiments. In the frontside metal layers of the VFET device 20, the first metal layer M0 extends in the y-direction.

FIG. 4 is a diagram schematically illustrating the filler structure 60 that includes first metal layer M0 64 connected to gate material MP 66 through a via over gate VG and a via material MP2, in accordance with some embodiments. The first metal layer 64 is connected through a via over gate VG and a via material MP2 to the gate material MP 66 that is connected through a deep via 68 to the backside contact 24. In some embodiments, the via material MP2 includes polycrystalline silicon and, in some embodiments, the gate material MP 66 includes polycrystalline silicon.

FIG. 5 is a diagram schematically illustrating the filler structure 62 that includes first metal layer M0 70 connected to MD layer 72 that is connected to gate material MP 74, in accordance with some embodiments. The first metal layer M0 70 is connected through a via over diffusion VD to the MD layer 72 that is connected through a via material MP2 to the gate material MP 74 that is connected through a deep via 76 to the backside contact 24. In some embodiments, the via material MP2 includes polycrystalline silicon and, in some embodiments, the gate material MP 74 includes polycrystalline silicon.

FIG. 6 is a diagram schematically illustrating a two-dimensional view of the filler structures 60 and 62, in accordance with some embodiments. The filler structure 60 includes the first metal layer 64 connected through a via over gate VG and a via material MP2 to the gate material MP 66 that is connected through a deep via 68 to the backside contact 24 (not shown in FIG. 5). The filler structure 62 includes the first metal layer M0 70 connected through a via over diffusion VD to the MD layer 72 that is connected through a via material MP2 to the gate material MP 74 that is connected through a deep via 76 to the backside contact 24 (not shown in FIG. 5). The filler structures 60 and 62 are small for reducing the area of the VFET device 20.

Figure 7:
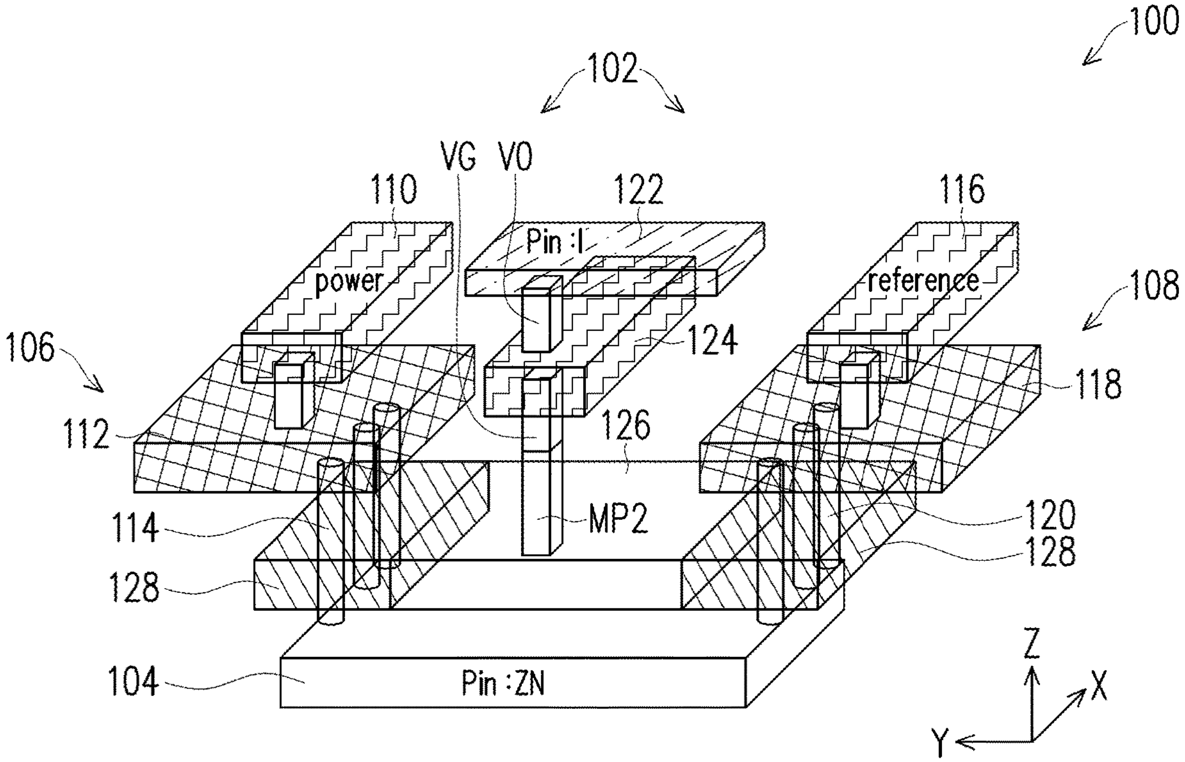
FIG. 7 is a diagram schematically illustrating a VFET device that is like the VFET device of FIG. 1 with a few differences including that the first metal layer M0 extends in the x-direction and the second metal layer M1 extends in the y-direction, in accordance with some embodiments.

FIG. 7 is a diagram schematically illustrating a VFET device 100 that is like the VFET device 20 of FIG. 1 with a few differences including that the first metal layer M0 extends in the x-direction and the second metal layer M1 extends in the y-direction, in accordance with some embodiments. The VFET device 100 includes frontside power contacts 102 and a backside contact 104.

The VFET device 100 is an inverter that includes a first VFET 106 and a second VFET 108 connected by the backside contact 104, which is the output pin ZN. The gates of the first VFET 106 and the second VFET 108 are connected at the input pin I. In some embodiments, the first VFET 106 is a PMOS transistor like the PMOS transistor 54 (shown in FIG. 3) and the second VFET 108 is an NMOS transistor like the NMOS transistor 56 (shown in FIG. 3).

The first VFET 106 includes a frontside voltage contact 110 in first metal layer M0 that is connected through a via over diffusion VD to the MD layer 112 that is in contact with a source region in the OD wires 114 of the first VFET 106. The OD wires 114 define the active areas of the first VFET 106 including the source, drain, and channel regions of the first VFET 106. The backside contact 104 is connected to the drain of the OD wires 114.

The second VFET 108 includes a frontside reference contact 116 in first metal layer M0 that is connected through a via over diffusion VD to the MD layer 118 that is in contact with a source in the OD wires 120 of the second VFET 108. The OD wires 120 define the active areas for the second VFET 108 including the source, drain, and channel regions of the second VFET 108. The backside contact 104 is connected to the drain of the OD wires 120.

The gates of the first VFET 106 and the second VFET 108 include a frontside input contact 122, input pin I, in second metal layer M1 that is connected through a via over gate VG to first metal layer M0 124 that is connected through a via over gate VG and a via material MP2 to a gate MP 126 that is connected to gate material MG 128 that surrounds the OD wires 114 and 120. In some embodiments, the via material MP2 includes polycrystalline silicon and, in some embodiments, the gate MP 126 includes polycrystalline silicon.

With frontside power contacts 102, vertical metal structures are not used to connect backside power contacts to the frontside of the VFET device 100. Also, the backside contact 104 is an output pin ZN that can be connected to other backside contacts and/or to other circuits. In some embodiments, the backside contact 104 is connected to the frontside using a filler structure that extends between the backside contact 104 and a frontside metal layer, such as first metal layer M0. In some embodiments, the two-dimensional backside contact 104 and/or the two-dimensional MD layers 112 and 118 are connected to multiple transistors, connecting the multiple transistors together.

Figure 8:
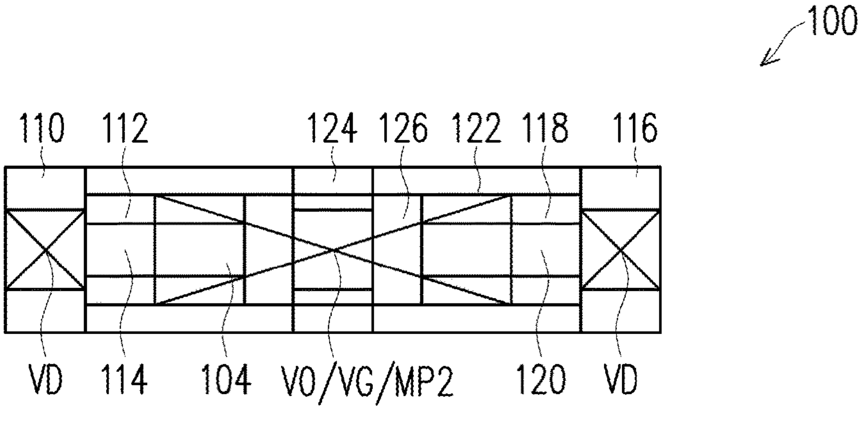
FIG. 8 is a diagram schematically illustrating a two-dimensional view of the VFET device of FIG. 7, in accordance with some embodiments.

FIG. 8 is a diagram schematically illustrating a two-dimensional view of the VFET device 100, in accordance with some embodiments. The two-dimensional view of the VFET device 100 includes different layers of the VFET device 100 in one stripe.

The two-dimensional view of the VFET device 100 includes the frontside voltage contact 110 in the first metal layer connected to the MD layer 112 that is in contact with the source region of the OD wires 114, where the drain region of the OD wires 114 is connected to the backside contact 104.

Also, the two-dimensional view of the VFET device 100 includes the frontside reference contact 116 in the first metal layer M0 that is connected to the MD layer 118 that is in contact with the source region of the OD wires 120, where the drain region of the OD wires 120 is connected to the backside contact 104.

In addition, the two-dimensional view of the VFET device 100 includes the frontside input contact 122, input pin I, in second metal layer M1 that is connected to first metal layer M0 124 that is connected to a gate MP 126 that is connected to gate material MG 128 that surrounds the OD wires 114 and 120.

Figure 9:
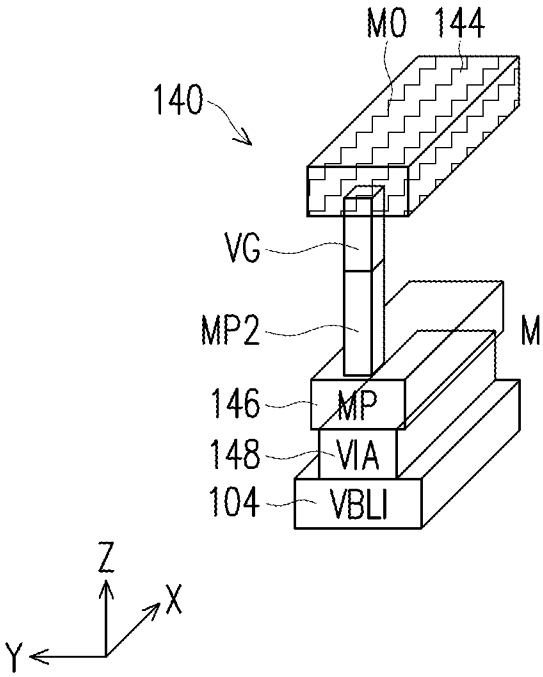
FIG. 9 is a diagram schematically illustrating a filler structure that includes a first metal layer M0 that extends in the x-direction and is connected to gate material MP, in accordance with some embodiments.
Figure 10:
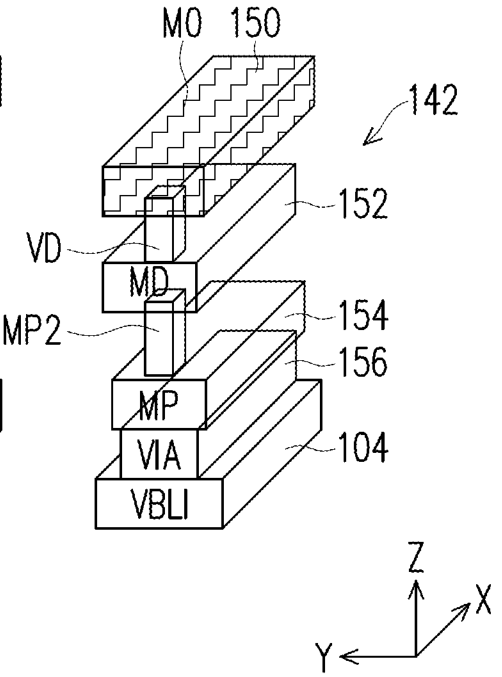
FIG. 10 is a diagram schematically illustrating a filler structure that includes a first metal layer M0 that extends in the x-direction and is connected to an MD layer, in accordance with some embodiments.
Figure 11:
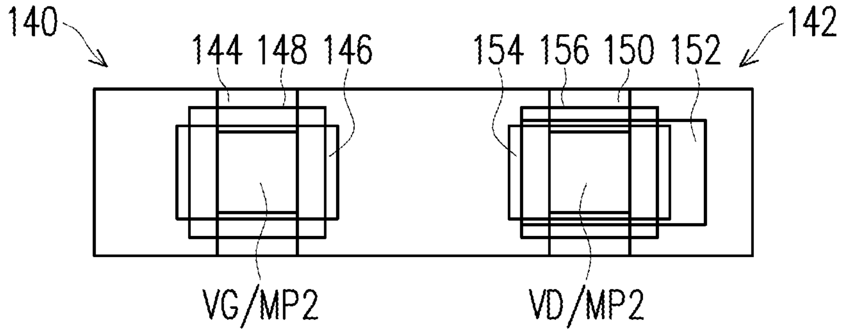
FIG. 11 is a diagram schematically illustrating a two-dimensional view of the filler structures of FIGS. 9 and 10, in accordance with some embodiments.

FIGS. 9-11 are diagrams schematically illustrating filler structures 140 and 142 including first metal layers M0 that extend in the x-direction, in accordance with some embodiments. The filler structures 140 and 142 can be used to connect the backside contact 104 to the frontside first metal layer M0.

FIG. 9 is a diagram schematically illustrating the filler structure 140 that includes first metal layer M0 144 that extends in the x-direction and is connected to gate material MP 146, in accordance with some embodiments. The first metal layer 144 is connected through a via over gate VG and a via material MP2 to the gate material MP 146 that is connected through a deep via 148 to the backside contact 104. In some embodiments, the via material MP2 includes polycrystalline silicon and, in some embodiments, the gate material MP 146 includes polycrystalline silicon.

FIG. 10 is a diagram schematically illustrating the filler structure 142 that includes first metal layer M0 150 that extends in the x-direction and is connected to MD layer 152, in accordance with some embodiments. The first metal layer M0 150 is connected through a via over diffusion VD to the MD layer 152 that is connected through a via material MP2 to the gate material MP 154 that is connected through a deep via 156 to the backside contact 104. In some embodiments, the via material MP2 includes polycrystalline silicon and, in some embodiments, the gate material MP 154 includes polycrystalline silicon.

FIG. 11 is a diagram schematically illustrating a two-dimensional view of the filler structures 140 and 142, in accordance with some embodiments. The filler structure 140 includes the first metal layer 144 connected through a via over gate VG and a via material MP2 to the gate material MP 146 that is connected through a deep via 148 to the backside contact 104 (not shown in FIG. 11). The filler structure 142 includes the first metal layer M0 150 connected through a via over diffusion VD to the MD layer 152 that is connected through a via material MP2 to the gate material MP 154 that is connected through a deep via 156 to the backside contact 104 (not shown in FIG. 11). The filler structures 140 and 142 are small for reducing the area of the VFET device 100.

Figure 12:
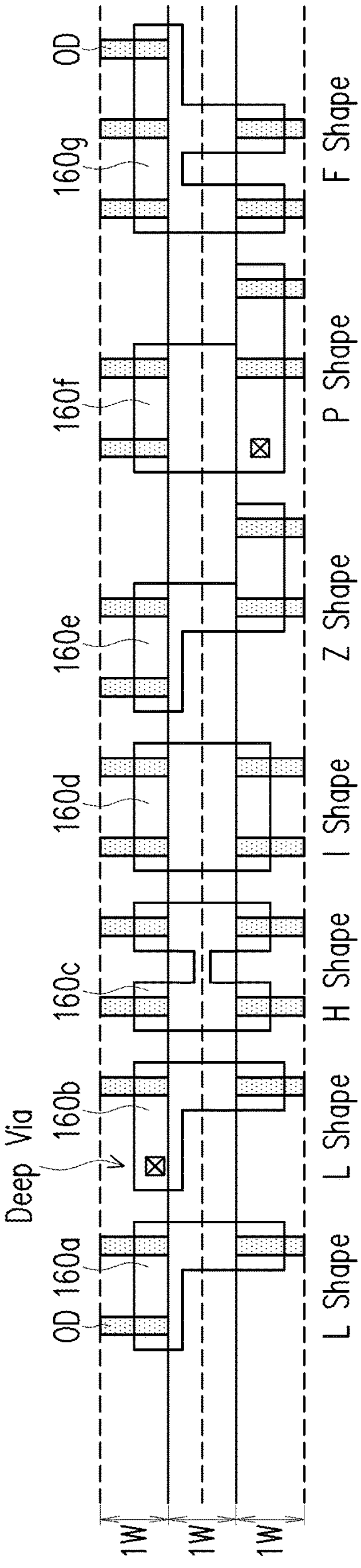
FIG. 12 is a diagram schematically illustrating two-dimensional backside contacts that have L, L, H, I, Z, P, and F shapes, in accordance with some embodiments.
Figure 13:
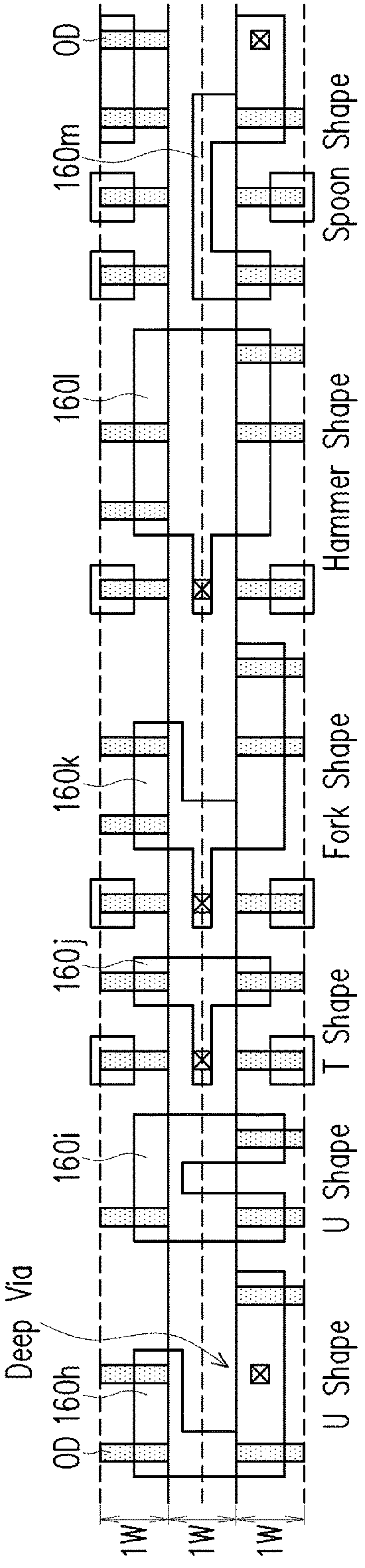
FIG. 13 is a diagram schematically illustrating two-dimensional backside contacts that have U, U, T, fork, hammer, and spoon shapes, in accordance with some embodiments.

FIGS. 12 and 13 are diagrams schematically illustrating two-dimensional backside contacts 160*a*-160*m* having different shapes, in accordance with some embodiments. The backside contacts 160*a*-160*m* are conductors that can be used with VFET devices, such as VFET device 20 of FIG. 1 and VFET device 100 of FIG. 7, and with filler structures, such as filler structures 60 and 62 of FIGS. 4-6 and filler structures 140 and 142 of FIGS. 9-11. The backside contacts 160*a*-160*m* connect drain/source regions of different OD regions together and/or to deep vias. All the different shapes of the backside contacts 160*a*-160*m* can be combined with each other to connect different OD regions and/or deep vias. In some embodiments, the backside contacts 160*a*-160*m* are like backside contact 24 (shown in FIG. 1) and backside contact 104 (shown in FIG. 7). In some embodiments, each of the OD regions has a width W and is separated from the next row of OD regions by the width W.

FIG. 12 is a diagram schematically illustrating the two-dimensional backside contacts 160*a*-160*g* having L, L, H, I, Z, P, and F shapes, respectively, in accordance with some embodiments. These backside contacts 160*a*-160*g* are shown connected to OD regions and/or deep vias, however this is illustrative, such that any of the OD regions can be changed to a deep via and any deep via can be changed to an OD region.

The backside contact 160*a* is an L-shaped backside contact connected to three OD regions and the backside contact 160*b* is an L-shaped backside contact connected to two OD regions and one deep via, where the deep via can be part of one of the filler structures or another structure. The backside contact 160*c* is an H-shaped backside contact connected to four OD regions, the backside contact 160*d* is an I-shaped backside contact connected to four OD regions, and the backside contact 160*e* is a Z-shaped backside contact connected to four OD regions. The backside contact 160*f* is a P-shaped backside contact connected to four OD regions and one deep via, where the deep via can be part of one of the filler structures or another structure, and the backside contact 160*g* is an F-shaped backside contact connected to five OD regions.

FIG. 13 is a diagram schematically illustrating the backside contacts 160*h*-160*m* having U, U, T, fork, hammer, and spoon shapes, respectively, in accordance with some embodiments. These backside contacts 160*h*-160*m* are shown connected to OD regions and/or deep vias, however this is illustrative, such that any of the OD regions can be changed to a deep via and any deep via can be changed to an OD region.

The backside contact 160*h* is a U-shaped backside contact connected to four OD regions and one deep via, where the deep via can be part of one of the filler structures or another structure, and the backside contact 160*i* is a U-shaped backside contact connected to three OD regions. The backside contact 160*j* is a T-shaped backside contact connected to two OD regions and one deep via, where the deep via can be part of one of the filler structures or another structure. The backside contact 160*k* is a fork-shaped backside contact connected to four OD regions and one deep via, where the deep via can be part of one of the filler structures or another structure, with two other OD regions. The backside contact 160*l* is a hammer-shaped backside contact connected to four OD regions and one deep via, where the deep via can be part of one of the filler structures or another structure, with two other OD regions, and the backside contact 160*m* is a spoon-shaped backside contact connected to two OD regions and one deep via, where the deep via can be part of one of the filler structures or another structure, with five other OD regions.

Advantages of the two-dimensional backside contacts 160*a*-160*m* include reducing the area of VFET devices, increasing gate density, and reducing metal layer coupling.

Figure 14:
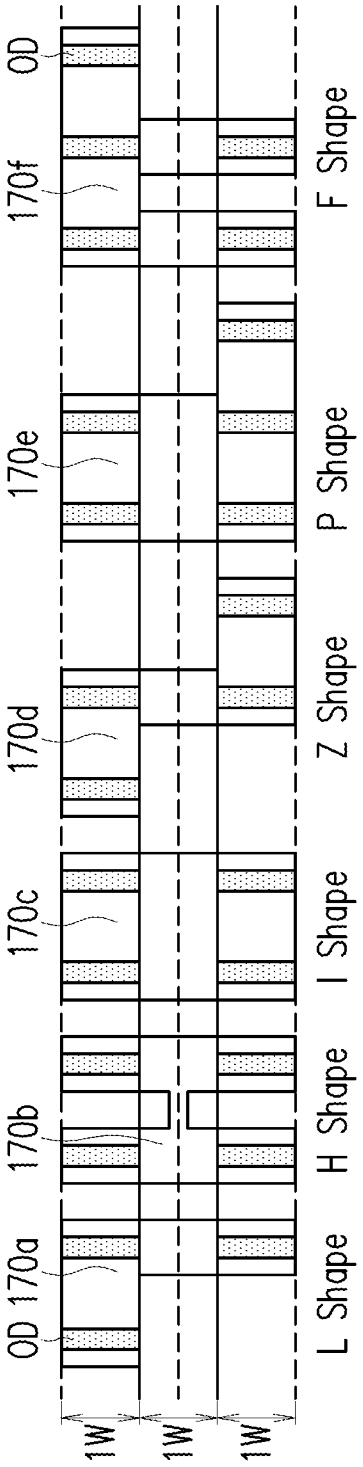
FIG. 14 is a diagram schematically illustrating two-dimensional MD layers that have L, H, I, Z, P, and F shapes, in accordance with some embodiments.
Figure 15:
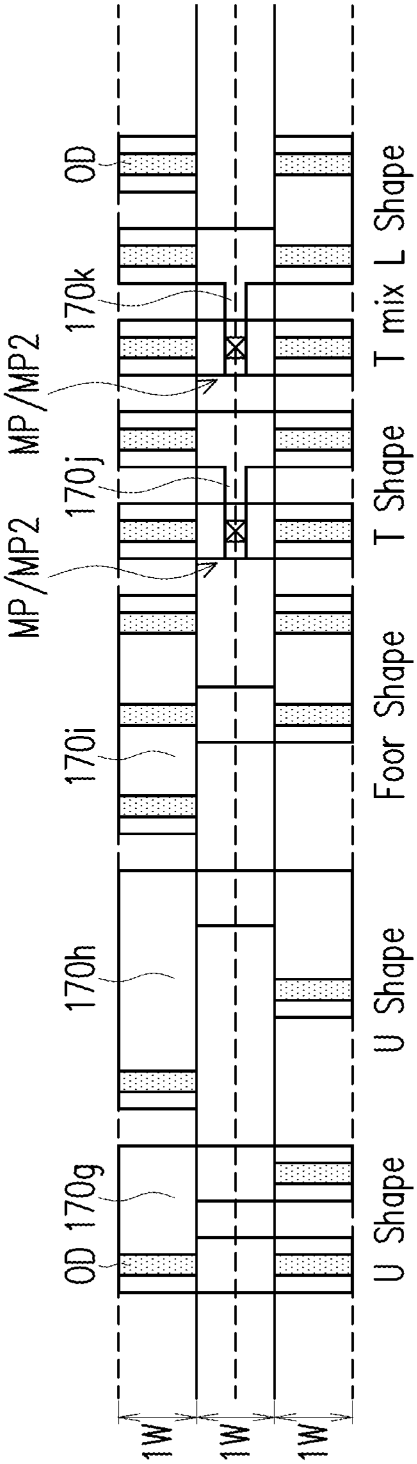
FIG. 15 is a diagram schematically illustrating two-dimensional MD layers that have U, U, four, T, and T-mixed-with-L shapes, in accordance with some embodiments.

FIGS. 14 and 15 are diagrams schematically illustrating two-dimensional MD layers 170*a*-170*k* having different shapes, in accordance with some embodiments. The MD layers 170*a*-170*k* are conductors that can be used with VFET devices, such as VFET device 20 of FIG. 1 and VFET device 100 of FIG. 7, and with filler structures, such as filler structure 62 of FIGS. 5 and 6 and filler structure 142 of FIGS. 10 and 11. The MD layers 170*a*-170*k* connect VFETs and other structures at the MD layers and through the via material MP2 to the gate material MP. All the different shapes of the MD layers 170*a*-170*k* can be combined with each other to connect different MD layers and gate material MP. In some embodiments, the MD layers 170*a*-170*k* are like MD layers 34 and 42 (shown in FIG. 1) and MD layers 112 and 118 (shown in FIG. 7). In some embodiments, each of the OD regions has a width W and is separated from the next row of OD regions by the width W.

FIG. 14 is a diagram schematically illustrating the two-dimensional MD layers 170*a*-170*f* having L, H, I, Z, P, and F shapes, respectively, in accordance with some embodiments. These MD layers 170*a*-170*f* are connected to OD regions and/or gate MPs.

The MD layer 170*a* is an L-shaped MD layer connected to three OD regions. The MD layer 170*b* is an H-shaped MD layer connected to four OD regions, the MD layer 170*c* is an I-shaped MD layer connected to four OD regions, and the MD layer 170*d* is a Z-shaped MD layer connected to four OD regions. The MD layer 170*e* is a P-shaped MD layer connected to five OD regions and the MD layer 170*f* is an F-shaped MD layer connected to five OD regions.

FIG. 15 is a diagram schematically illustrating the MD layers 170*g*-170*k* having U, U, four, T, and T-mixed-with-L shapes, respectively, in accordance with some embodiments. These MD layers 170*g*-170*k* are connected to OD regions and/or gate MPs.

The MD layer 170*g* is a U-shaped MD layer connected to three OD regions and the MD layer 170*h* is a U-shaped MD layer connected to two OD regions. The MD layer 170*i* is a four-shaped MD layer connected to five OD regions. The MD layer 170*j* is a T-shaped MD layer connected to two OD regions and one gate MP through a via material MP2, with two other OD regions. The MD layer 170*k* is a T-mixed-with-L-shaped MD layer connected to three OD regions and one gate MP through a via material MP2, with three other OD regions.

Advantages of the two-dimensional MD layers 170*a*-170*k* include connecting signals at the MD layer instead of at the metal layers, which increases the flexibility of routing, reduces the area of a VFET device, increases gate density, and reduces metal layer coupling.

Figure 16:
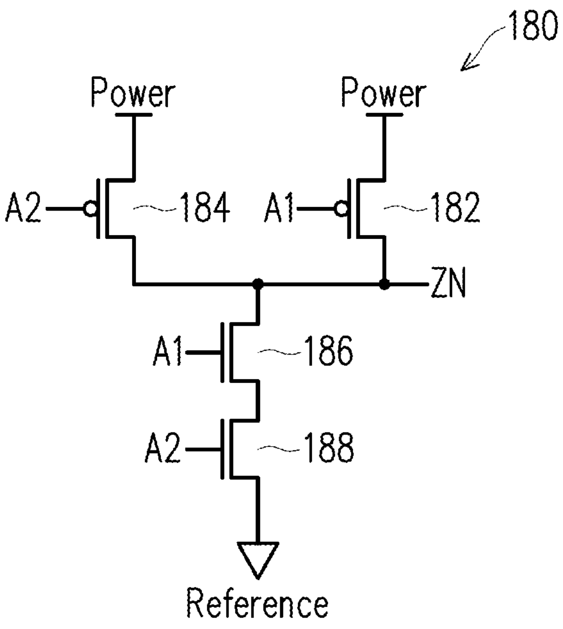
FIG. 16 is a diagram schematically illustrating a CMOS NAND gate, in accordance with some embodiments.

FIG. 16 is a diagram schematically illustrating a complementary metal-oxide semiconductor (CMOS) NAND gate 180, in accordance with some embodiments. The NAND gate 180 include a first PMOS transistor 182, a second PMOS transistor 184, a first NMOS transistor 186, and a second NMOS transistor 188. One drain/source region of the first PMOS transistor 182 is connected to a power voltage contact and one drain/source region of the second PMOS transistor 184 is connected to a power voltage contact. The other drain/source regions of the first and second PMOS transistors 182 and 184 are connected to each other and to one drain/source region of the first NMOS transistor 186 at output ZN. The other drain/source region of the first NMOS transistor 186 is connected to one drain/source region of the second NMOS transistor 188 and the other drain/source region of the second NMOS transistor 188 is connected to a reference contact, such as ground.

The gates of the first PMOS transistor 182 and the first NMOS transistor 186 are connected to input A1, and the gates of the second PMOS transistor 184 and the second NMOS transistor 188 are connected to input A2.

In operation NAND gate 180 performs a NAND gate function on the inputs A1 and A2 and provides an output signal at the output ZN.

Figure 17:
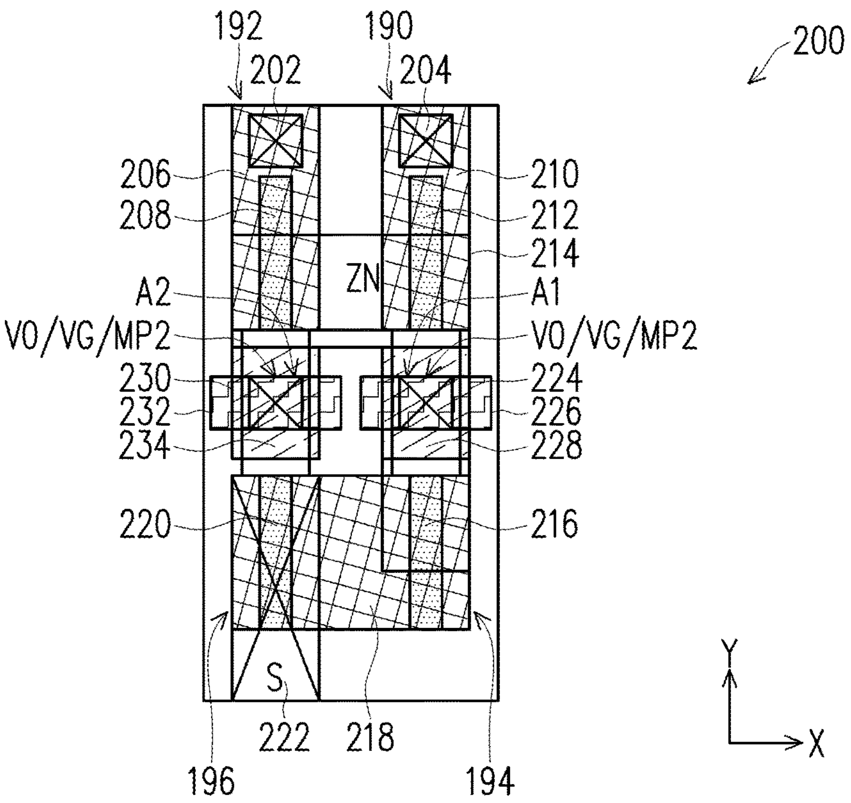
FIG. 17 is a diagram schematically illustrating a NAND gate that has a first metal layer M0 extending in the x-direction and a second metal layer M1 extending in the y-direction, in accordance with some embodiments.

FIG. 17 is a diagram schematically illustrating a NAND gate 200 that has first metal layer M0 extending in the x-direction and second metal layer M1 extending in the y-direction, in accordance with some embodiments. As an example of this type of routing, the first metal layer M0 extends in the x-direction and the second metal layer M1 extends in the y-direction in the VFET device 100 of FIG. 7.

The NAND gate 200 includes a first PMOS transistor 190 that is like the first PMOS transistor 182 (shown in FIG. 16) and a second PMOS transistor 192 that is like the second PMOS transistor 184 (shown in FIG. 16). The NAND gate 200 includes frontside power contacts 202 and 204 that are each connected to a power voltage. The first power contact 202 is connected to a first MD layer 206 that is connected to a drain/source region of a first OD region 208 and the second power contact 204 is connected to a second MD layer 210 that is connected to a drain/source region of a second OD region 212. The other drain/source regions of each of the first OD region 208 and the second OD region 212 are connected to an L-shaped backside contact 214, which is the output ZN of the NAND gate 200.

The L-shaped backside contact 214 is further connected to a first NMOS transistor 194 that is like the first NMOS transistor 186 (shown in FIG. 16). The L-shaped backside contact 214 is connected to a drain/source region of a third OD region 216 that has another drain/source region connected to a third MD layer 218 that is connected to a second NMOS transistor 196 that is like the second NMOS transistor 188 (shown in FIG. 16). The third MD layer 218 is connected to a drain/source region of a fourth OD region 220 having another drain/source region connected to a pinned backside contact 222 that is a reference, such as ground.

The NAND gate 200 has two inputs A1 and A2. The first input A1 includes second metal layer 224 connected through via V0 to first metal layer 226 that is connected through via VG and via material MP2 to gate MP 228. The second input A2 includes second metal layer 230 connected through via V0 to first metal layer 232 that is connected through via VG and via material MP2 to gate MP 234.

The NAND gate 200 includes the L-shaped backside contact 214 and the MD layer 218 for connecting different OD regions without using frontside metal layers. Thus, the advantages of the two-dimensional backside contact 214 and the MD layer 218 include connecting signals at the backside contact 214 and the MD layer 218 instead of at frontside metal layers, which increases the flexibility of routing, reduces the area of a VFET device, increases gate density, and reduces metal layer coupling.

Figure 18:
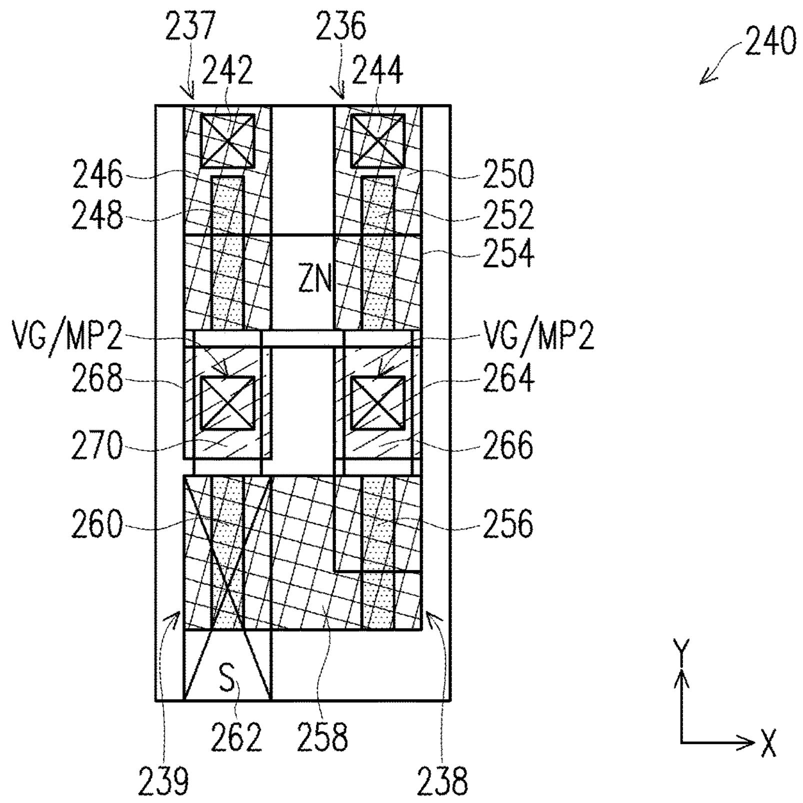
FIG. 18 is a diagram schematically illustrating a NAND gate that has a first metal layer M0 extending in the y-direction and a second metal layer M1 extending in the x-direction, in accordance with some embodiments.

FIG. 18 is a diagram schematically illustrating a NAND gate 240 that has first metal layer M0 extending in the y-direction and second metal layer M1 extending in the x-direction, in accordance with some embodiments. As an example of this type of routing, the first metal layer M0 extends in the y-direction and the second metal layer M1 extends in the x-direction in the VFET device 20 of FIG. 1.

The NAND gate 240 includes a first PMOS transistor 236 that is like the first PMOS transistor 182 (shown in FIG. 16) and a second PMOS transistor 237 that is like the second PMOS transistor 184 (shown in FIG. 16). The NAND gate 200 includes frontside power contacts 242 and 244 that are each connected to a power voltage. The first power contact 242 is connected to a first MD layer 246 that is connected to a drain/source region of a first OD region 248 and the second power contact 244 is connected to a second MD layer 250 that is connected to a drain/source region of a second OD region 252. The other drain/source regions of each of the first OD region 248 and the second OD region 252 are connected to an L-shaped backside contact 254, which is the output ZN of the NAND gate 240.

The L-shaped backside contact 254 is further connected to a first NMOS transistor 238 that is like the first NMOS transistor 186 (shown in FIG. 16). The L-shaped backside contact 254 is further connected to a drain/source region of a third OD region 256 that has another drain/source region connected to a third MD layer 258 that is connected to a second NMOS transistor 239 that is like the second NMOS transistor 188 (shown in FIG. 16). The third MD layer 258 is connected to a drain/source region of a fourth OD region 260 having another drain/source region connected to a pinned backside contact 262 that is a reference, such as ground.

The NAND gate 240 has two inputs A1 and A2. The first input A1 includes first metal layer 264 that is connected through via VG and via material MP2 to gate MP 266. The second input A2 includes first metal layer 268 that is connected through via VG and via material MP2 to gate MP 270.

The NAND gate 240 includes the L-shaped backside contact 254 and the MD layer 258 for connecting different OD regions without using frontside metal layers. Thus, the advantages of the two-dimensional backside contact 254 and the MD layer 258 include connecting signals at the backside contact 254 and the MD layer 258 instead of at frontside metal layers, which increases the flexibility of routing, reduces the area of a VFET device, increases gate density, and reduces metal layer coupling.

Figure 19:
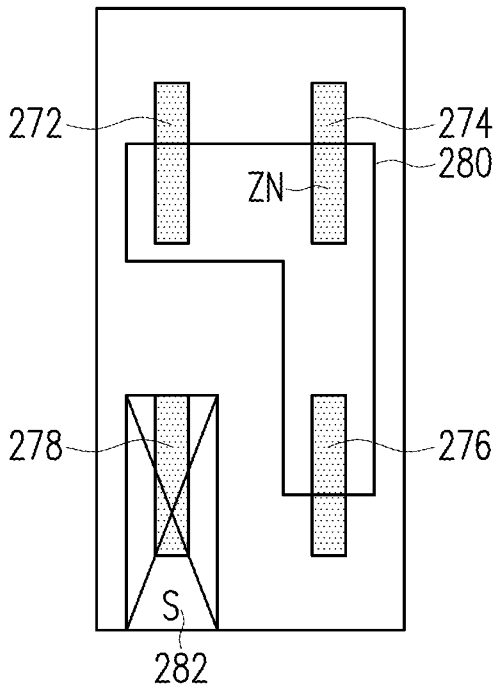
FIG. 19 is a diagram schematically illustrating OD regions, the L-shaped backside contact, and the pinned backside contact for the NAND gate of FIG. 17 and the NAND gate of FIG. 18, in accordance with some embodiments.

FIG. 19 is a diagram schematically illustrating the OD regions, the L-shaped backside contact, and the pinned backside contact for the NAND gate 200 of FIG. 17 and the NAND gate 240 of FIG. 18, in accordance with some embodiments. The first OD region 272 is like each of the first OD regions 208 and 248, the second OD region 274 is like each of the second OD regions 212 and 252, the third OD region 276 is like each of the third OD regions 216 and 256, and the fourth OD region 278 is like each of the fourth OD regions 220 and 260. The L-shaped backside contact 280 is like each of the L-shaped backside contacts 214 and 254, and the pinned backside contact 282 is like each of the pinned backside contacts 222 and 262.

Figure 20:
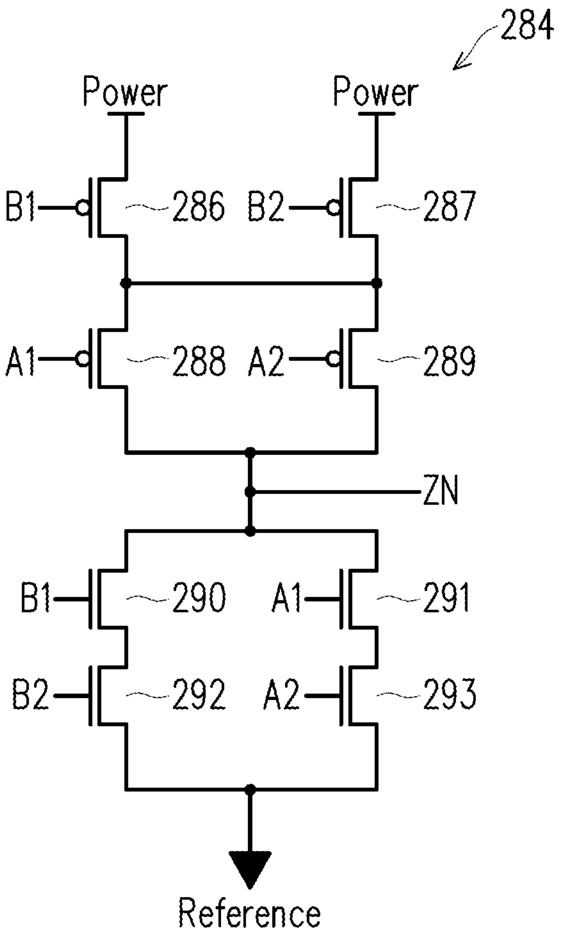
FIG. 20 is a diagram schematically illustrating a four input And-Or-Invert (AOI) gate, in accordance with some embodiments.

FIG. 20 is a diagram schematically illustrating a four input And-Or-Invert (AOI) gate 284, in accordance with some embodiments. The AOI gate 284 includes a first PMOS transistor 286, a second PMOS transistor 287, a third PMOS transistor 288, and a fourth PMOS transistor 289. The AOI gate 284 further includes a first NMOS transistor 290, a second NMOS transistor 291, a third NMOS transistor 292, and a fourth NMOS transistor 293.

One drain/source region of the first PMOS transistor 286 is connected to a power voltage contact and one drain/source region of the second PMOS transistor 287 is connected to a power voltage contact. The other drain/source regions of the first and second PMOS transistors 286 and 287 are connected to each other and to one drain/source region of the third PMOS transistor 288 and to one drain/source region of the fourth PMOS transistor 289. The other drain/source regions of the third PMOS transistor 288 and the fourth PMOS transistor 289 are connected to each other and to one drain/source region of the first NMOS transistor 290 and to one drain/source region of the second NMOS transistor 291 at the output ZN. The other drain/source region of the first NMOS transistor 290 is connected to one drain/source region of the third NMOS transistor 292, and the other drain/source region of the second NMOS transistor 291 is connected to one drain/source region of the fourth NMOS transistor 293. The other drain/source regions of the third NMOS transistor 292 and the fourth NMOS transistor 293 are connected to a reference, such as ground.

The gates of the first PMOS transistor 286 and the first NMOS transistor 290 are connected to input B1, the gates of the second PMOS transistor 287 and the third NMOS transistor 292 are connected to input B2, the gates of the third PMOS transistor 288 and the second NMOS transistor 291 are connected to input A1, and the gates of the fourth PMOS transistor 289 and the fourth NMOS transistor 293 are connected to input A2.

In operation, AOI gate 284 performs an And-Or-Invert function on the inputs A1, A2, B1, and B2 and provides an output signal at the output ZN.

Figure 21:
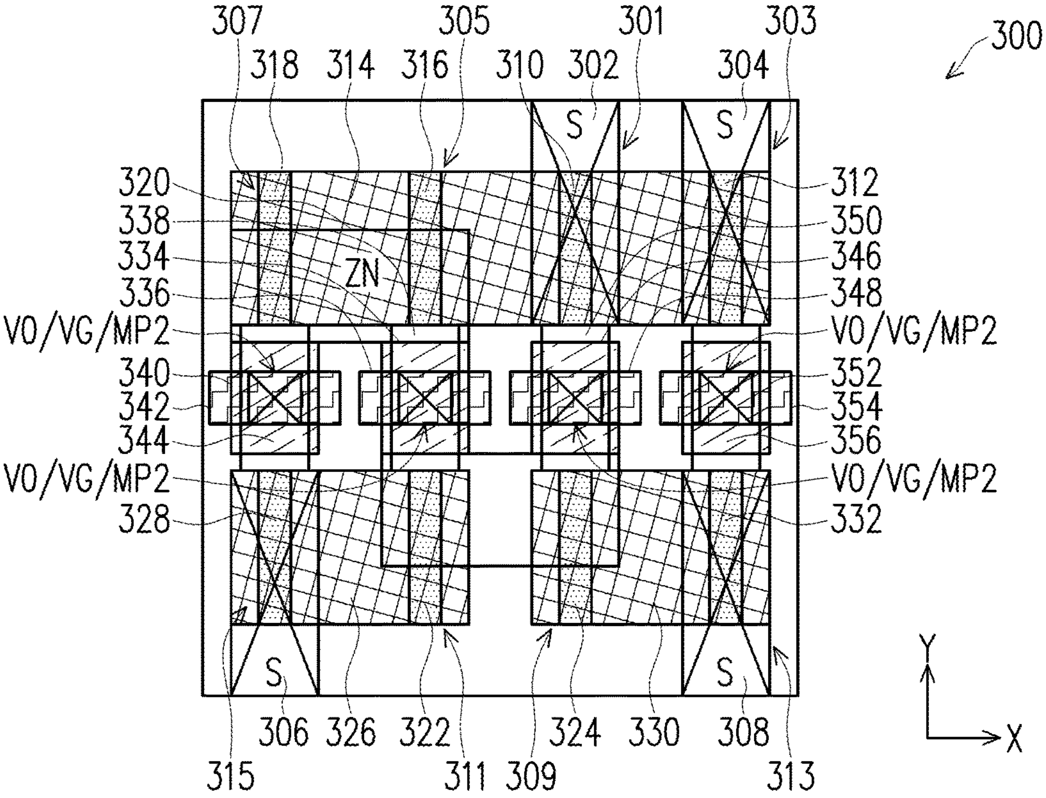
FIG. 21 is a diagram schematically illustrating an AOI gate that has first metal layer M0 extending in the x-direction and second metal layer M1 extending in the y-direction, in accordance with some embodiments.

FIG. 21 is a diagram schematically illustrating an And-Or-Invert (AOI) gate 300 that has first metal layer M0 extending in the x-direction and second metal layer M1 extending in the y-direction, in accordance with some embodiments. As an example of this type of routing, the first metal layer M0 extends in the x-direction and the second metal layer M1 extends in the y-direction in the VFET device 100 of FIG. 7 and in the NAND gate 200 of FIG. 17.

The AOI gate 300 includes a first PMOS transistor 301 that is like the first PMOS transistor 286 (shown in FIG. 20), a second PMOS transistor 303 that is like the second PMOS transistor 287 (shown in FIG. 20), a third PMOS transistor 305 that is like the third PMOS transistor 288 (shown in FIG. 20), and a fourth PMOS transistor 307 that is like the fourth PMOS transistor 289 (shown in FIG. 20). The AOI gate 300 further includes a first NMOS transistor 309 that is like the first NMOS transistor 290 (shown in FIG. 20), a second NMOS transistor 311 that is like the second NMOS transistor 291 (shown in FIG. 20), a third NMOS transistor 313 that is like the third NMOS transistor 292 (shown in FIG. 20), and a fourth NMOS transistor 315 that is like the fourth NMOS transistor 293 (shown in FIG. 20).

The AOI gate 300 includes pinned backside contacts 302, 304, 306, and 308. The pinned backside contacts 302 and 304 are connected to one or more power voltage contacts.

The pinned backside contact 302 is connected to a drain/source region of a first OD region 310 and the pinned backside contact 304 is connected to a drain/source region of a second OD region 312. The other drain/source region of each of the first OD region 310 and the second OD region 312 is connected to an MD layer 314 that connects them to each other and to the third PMOS transistor 305 and the fourth PMOS transistor 307. The MD layer 314 is connected to a drain/source region of each of a third OD region 316 and a fourth OD region 318. The other drain/source region of each of the third OD region 316 and the fourth OD region 318 is connected to a Z-shaped backside contact 320, which is the output ZN of the AOI gate 300.

The Z-shaped backside contact 320 is further connected to the first NMOS transistor 309 and the second NMOS transistor 311. The Z-shaped backside contact 320 is connected to a drain/source region of each of a fifth OD region 322 and a sixth OD region 324. The other drain/source region of the fifth OD region 322 is connected to a second MD layer 326 that is connected to the fourth NMOS transistor 315 at a drain/source region of a seventh OD region 328 and the other drain/source region of the seventh OD region 328 is connected to the pinned backside contact 306, which is a reference contact. The other drain/source region of the sixth OD region 324 is connected to a third MD layer 330 that is connected to the third NMOS transistor 313 at a drain/source region of an eighth OD region 332 and the other drain/source region of the eighth OD region 332 is connected to the pinned backside contact 308, which is a reference contact.

The AOI gate 300 has four inputs A1, A2, B1, and B2. The first input A1 is connected to the third PMOS transistor 305 and the second NMOS transistor 311 and includes a second metal layer 334 connected through via V0 to a first metal layer 336 that is connected through via VG and via material MP2 to gate MP 338. The second input A2 is connected to the fourth PMOS transistor 307 and the fourth NMOS transistor 315 and includes a second metal layer 340 connected through via V0 to a first metal layer 342 that is connected through via VG and via material MP2 to gate MP 344. The third input B1 is connected to the first PMOS transistor 301 and the first NMOS transistor 309 and includes a second metal layer 346 connected through via V0 to a first metal layer 348 that is connected through via VG and via material MP2 to gate MP 350, and the fourth input B2 is connected to the second PMOS transistor 303 and the third NMOS transistor 313 and includes a second metal layer 352 connected through via V0 to a first metal layer 354 that is connected through via VG and via material MP2 to gate MP 356.

The AOI gate 300 includes the Z-shaped backside contact 320 and the MD layers for connecting different OD regions without using frontside metal layers. Thus, the advantages of the two-dimensional backside contact 320 and the MD layers include connecting signals at the backside contact 320 and the MD layers instead of at frontside metal layers, which increases the flexibility of routing, reduces the area of a VFET device, increases gate density, and reduces metal layer coupling.

Figure 22:
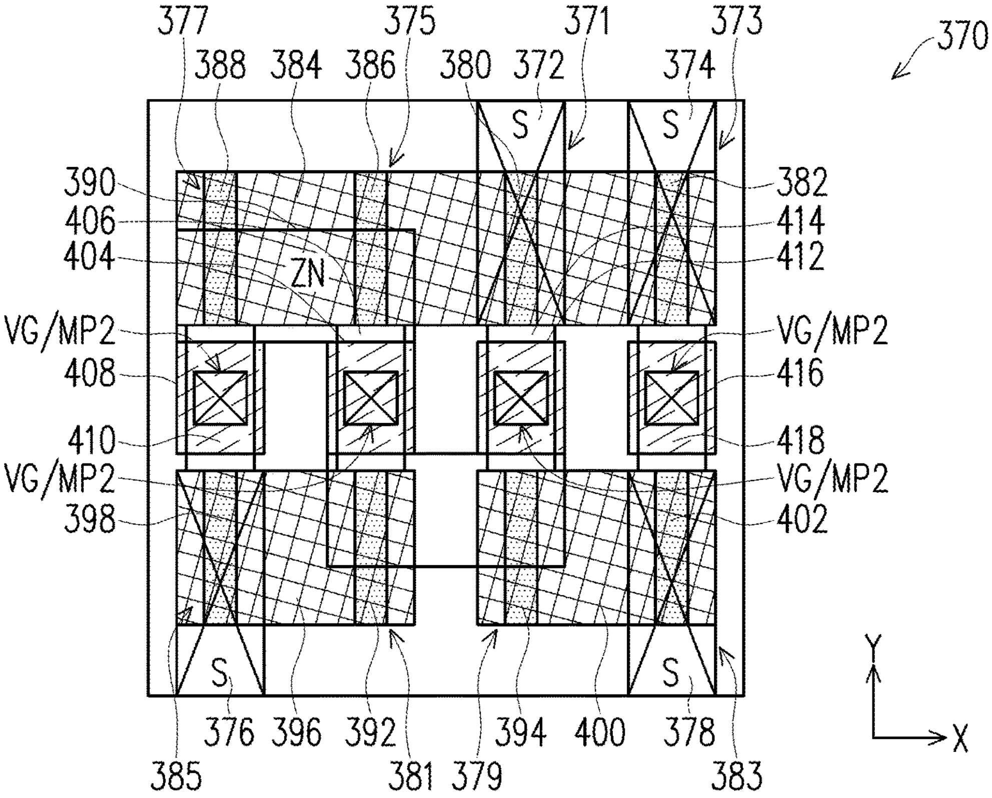
FIG. 22 is a diagram schematically illustrating an AOI gate that has first metal layer M0 extending in the y-direction and second metal layer M1 extending in the x-direction, in accordance with some embodiments.

FIG. 22 is a diagram schematically illustrating an AOI gate 370 that has first metal layer M0 extending in the y-direction and second metal layer M1 extending in the x-direction, in accordance with some embodiments. As an example of this type of routing, the first metal layer M0 extends in the y-direction and the second metal layer M1 extends in the x-direction in the VFET device 20 of FIG. 1 and in the NAND gate 240 of FIG. 18.

The AOI gate 370 includes a first PMOS transistor 371 that is like the first PMOS transistor 286 (shown in FIG. 20), a second PMOS transistor 373 that is like the second PMOS transistor 287 (shown in FIG. 20), a third PMOS transistor 375 that is like the third PMOS transistor 288 (shown in FIG. 20), and a fourth PMOS transistor 377 that is like the fourth PMOS transistor 289 (shown in FIG. 20). The AOI gate 370 further includes a first NMOS transistor 379 that is like the first NMOS transistor 290 (shown in FIG. 20), a second NMOS transistor 381 that is like the second NMOS transistor 291 (shown in FIG. 20), a third NMOS transistor 383 that is like the third NMOS transistor 292 (shown in FIG. 20), and a fourth NMOS transistor 385 that is like the fourth NMOS transistor 293 (shown in FIG. 20).

The AOI gate 370 includes pinned backside contacts 372, 374, 376, and 378. The pinned backside contacts 372 and 374 are connected to one or more power voltage contacts. The pinned backside contact 372 is connected to a drain/source region of a first OD region 380 and the pinned backside contact 374 is connected to a drain/source region of a second OD region 382. The other drain/source region of each of the first OD region 380 and the second OD region 382 is connected to an MD layer 384 that connects them to each other and to the third PMOS transistor 375 and the fourth PMOS transistor 377. The MD layer 314 is connected to a drain/source region of each of a third OD region 386 and a fourth OD region 388. The other drain/source region of each of the third OD region 386 and the fourth OD region 388 is connected to a Z-shaped backside contact 390, which is the output ZN of the AOI gate 370.

The Z-shaped backside contact 390 is further connected to the first NMOS transistor 379 and the second NMOS transistor 381. The Z-shaped backside contact 390 is connected to a drain/source region of each of a fifth OD region 392 and a sixth OD region 394. The other drain/source region of the fifth OD region 392 is connected to a second MD layer 396 that is connected to the fourth NMOS transistor 385 at a drain/source region of a seventh OD region 398 and the other drain/source region of the seventh OD region 398 is connected to the pinned backside contact 376, which is a reference contact. The other drain/source region of the sixth OD region 394 is connected to a third MD layer 400 that is connected to the third NMOS transistor 383 at a drain/source region of an eighth OD region 402 and the other drain/source region of the eighth OD region 402 is connected to the pinned backside contact 378, which is a reference contact.

The AOI gate 370 has four inputs A1, A2, B1, and B2. The first input A1 is connected to the third PMOS transistor 375 and the second NMOS transistor 381 and includes a first metal layer 404 that is connected through via VG and via material MP2 to gate MP 406. The second input A2 is connected to the fourth PMOS transistor 377 and the fourth NMOS transistor 385 and includes a first metal layer 408 that is connected through via VG and via material MP2 to gate MP 410. The third input B1 is connected to the first PMOS transistor 371 and the first NMOS transistor 379 and includes a first metal layer 412 that is connected through via VG and via material MP2 to gate MP 414, and the fourth input B2 is connected to the second PMOS transistor 373 and the third NMOS transistor 383 and includes a first metal layer 416 that is connected through via VG and via material MP2 to gate MP 418.

The AOI gate 370 includes the Z-shaped backside contact 390 and the MD layers for connecting different OD regions without using frontside metal layers. Thus, the advantages of the two-dimensional backside contact 390 and the MD layers include connecting signals at the backside contact 390 and the MD layers instead of at frontside metal layers, which increases the flexibility of routing, reduces the area of a VFET device, increases gate density, and reduces metal layer coupling.

Figure 23:
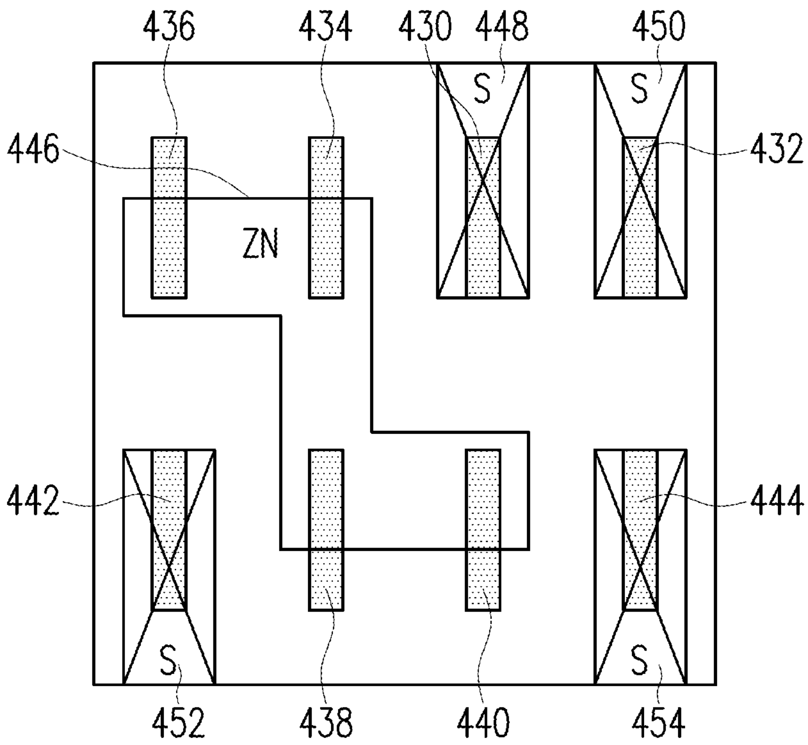
FIG. 23 is a diagram schematically illustrating OD regions, the Z-shaped backside contact, and the pinned backside contacts for the AOI gate of FIG. 21 and the AOI gate of FIG. 22, in accordance with some embodiments.

FIG. 23 is a diagram schematically illustrating the OD regions, the Z-shaped backside contact, and the pinned backside contacts for the AOI gate 300 of FIG. 21 and the AOI gate 370 of FIG. 22, in accordance with some embodiments. The first OD region 430 is like each of the first OD regions 310 and 380, the second OD region 432 is like each of the second OD regions 312 and 382, the third OD region 434 is like each of the third OD regions 316 and 386, and the fourth OD region 436 is like each of the fourth OD regions 318 and 388. Also, the fifth OD region 438 is like each of the fifth OD regions 322 and 392, the sixth OD region 440 is like each of the sixth OD regions 324 and 394, the seventh OD region 442 is like each of the seventh OD regions 328 and 398, and the eighth OD region 444 is like each of the eighth OD regions 332 and 402.

The Z-shaped backside contact 446 is like each of the Z-shaped backside contacts 320 and 390, and the first pinned backside contact 448 is like each of the pinned backside contacts 302 and 372, the second pinned backside contact 450 is like each of the pinned backside contacts 304 and 374, the third pinned backside contact 452 is like each of the pinned backside contacts 306 and 376, the fourth pinned backside contact 454 is like each of the pinned backside contacts 308 and 378.

Figure 24:
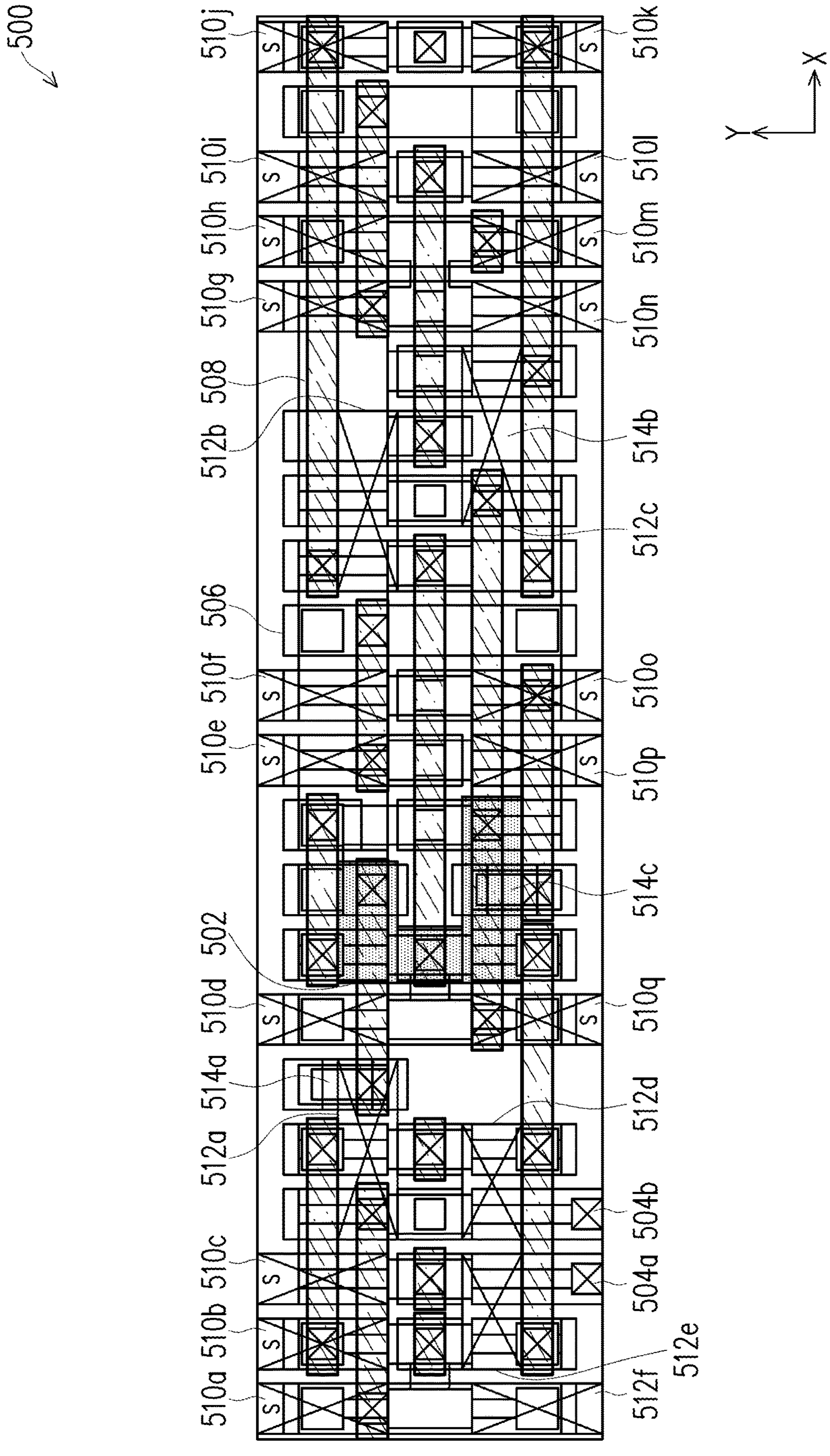
FIG. 24 is a diagram schematically illustrating a flip-flop circuit having a U-shaped backside contact and two frontside power contacts, in accordance with some embodiments.

FIG. 24 is a diagram schematically illustrating a flip-flop circuit 500 having a U-shaped backside contact 502 and two frontside power contacts 504*a* and 504*b*, in accordance with some embodiments. The flip-flop circuit 500 has a 22 CPP area with first metal layer M0 506 extending in the y-direction and second metal layer M1 508 extending in the x-direction. The flip-flop circuit 500 includes pinned backside contacts 510*a*-510*q*, backside contacts 512*a*-512*f*, and deep via layers 514*a*-514*c*.

Figure 25:
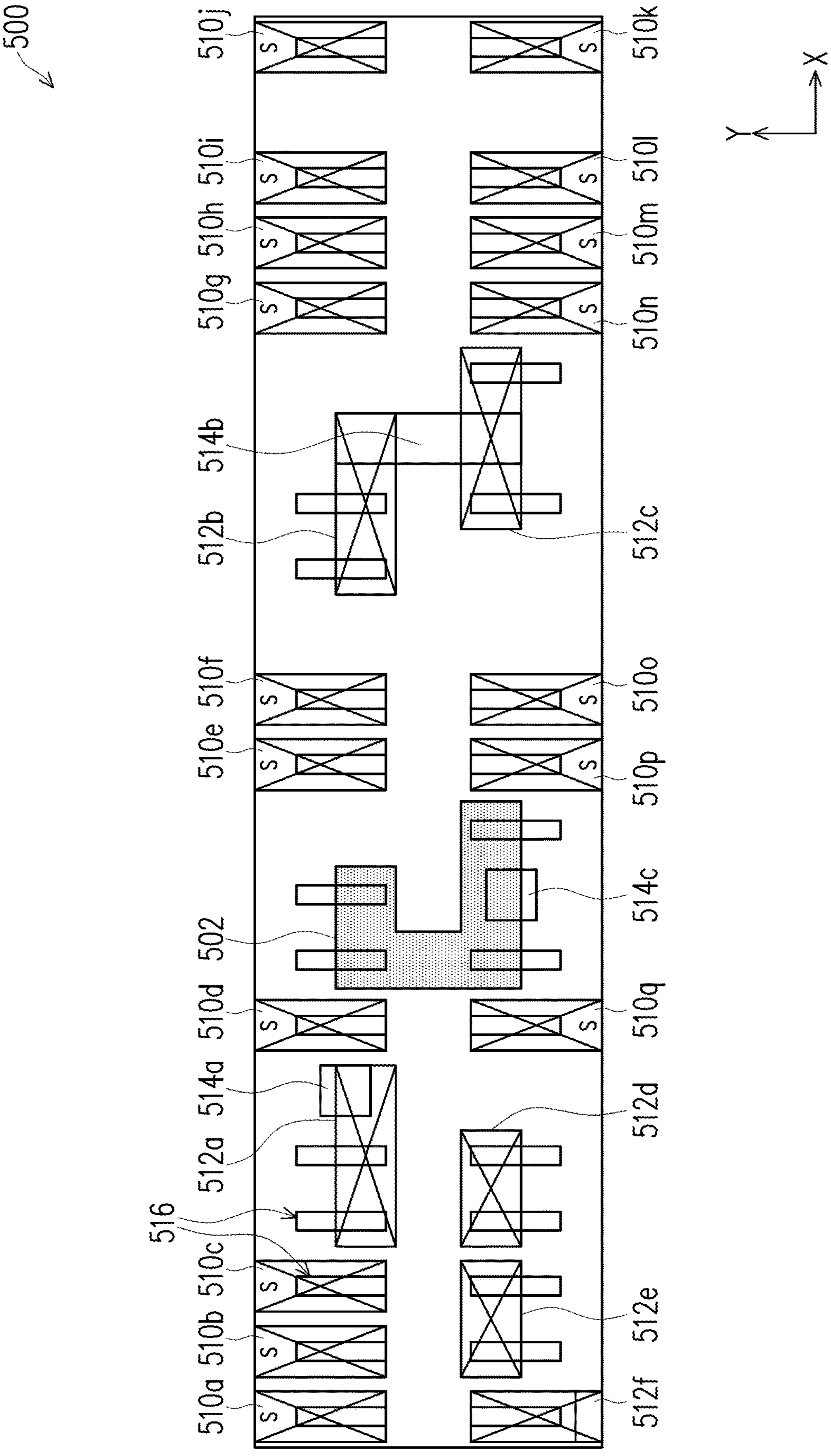
FIG. 25 is a diagram schematically illustrating the U-shaped backside contact, the pinned backside contacts, the backside contacts, the deep via layers, and the OD regions of the flip-flop circuit of FIG. 24, in accordance with some embodiments.

FIG. 25 is a diagram schematically illustrating the U-shaped backside contact 502, the pinned backside contacts 510*a*-510*q*, the backside contacts 512*a*-512*f*, the deep via layers 514*a*-514*c*, and OD regions 516, in accordance with some embodiments.

Advantages of the U-shaped backside contact 502, the frontside power contacts 504*a* and 504*b*, the backside contacts 512*a*-512*f*, and the deep via layers 514*a*-514*c* include connecting signals at these contacts and layers instead of at frontside metal layers. This increases the flexibility of routing, reduces the area of the VFET device, increases gate density, and reduces metal layer coupling.

Figure 26:
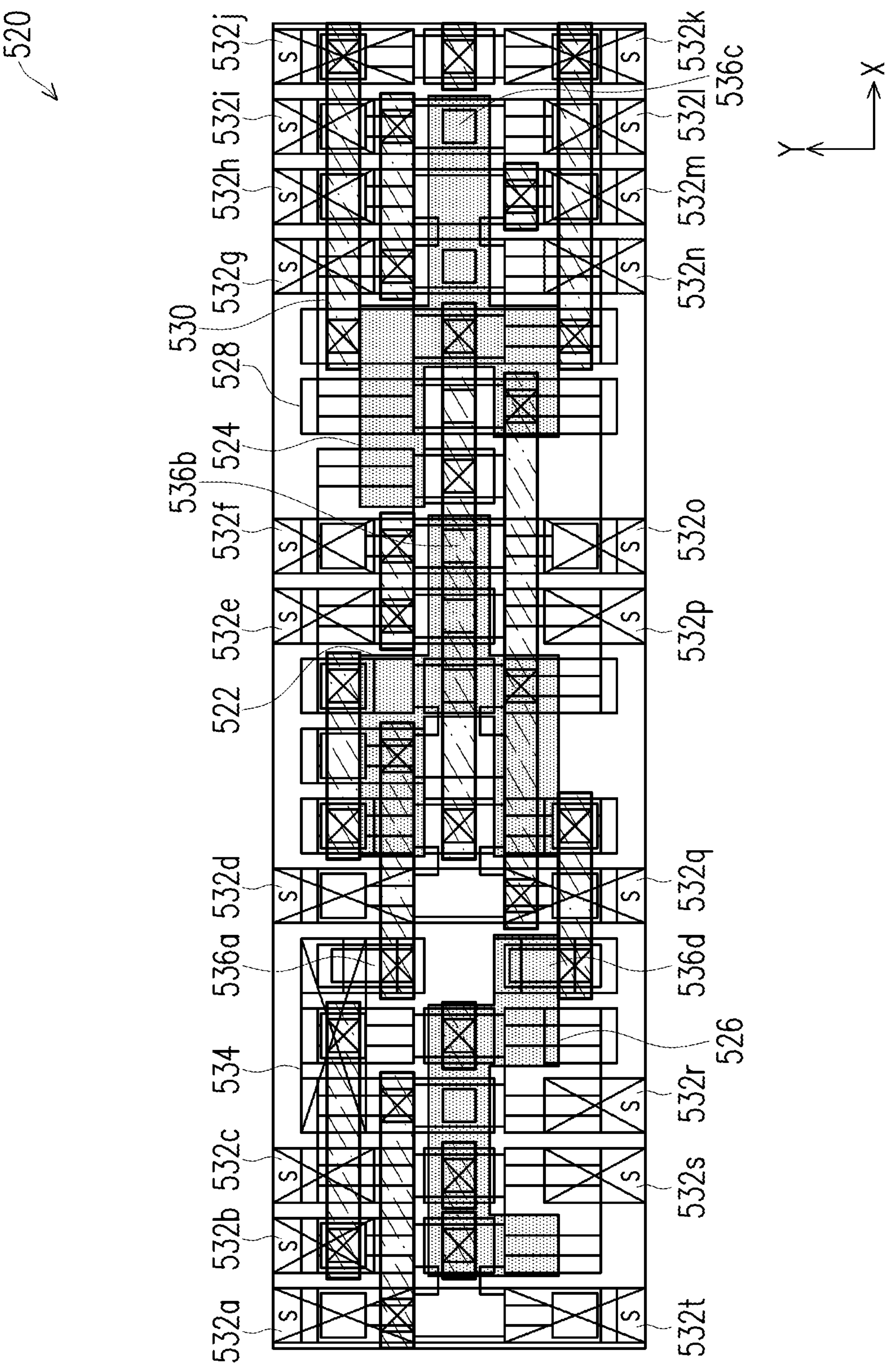
FIG. 26 is a diagram schematically illustrating a flip-flop circuit having two fork-shaped backside contacts and a spoon-shaped backside contact, in accordance with some embodiments.

FIG. 26 is a diagram schematically illustrating a flip-flop circuit 520 having two fork-shaped backside contacts 522 and 524 and a spoon-shaped backside contact 526, in accordance with some embodiments. The flip-flop circuit 520 has a 19 CPP area with first metal layer M0 528 extending in the y-direction and second metal layer M1 530 extending in the x-direction. Thus, the flip-flop circuit 520 with the two fork-shaped backside contacts 522 and 524 and the spoon-shaped backside contact 526 is smaller than the flip-flop circuit 500 of FIGS. 24 and 25. The flip-flop circuit 520 further includes pinned backside contacts 532*a*-532*t*, backside contact 534, and deep via layers 536*a*-536*d*. In some embodiments, at least one of the fork-shaped backside contacts 522 and 524 is changed to a hammer-shaped backside contact.

Figure 27:
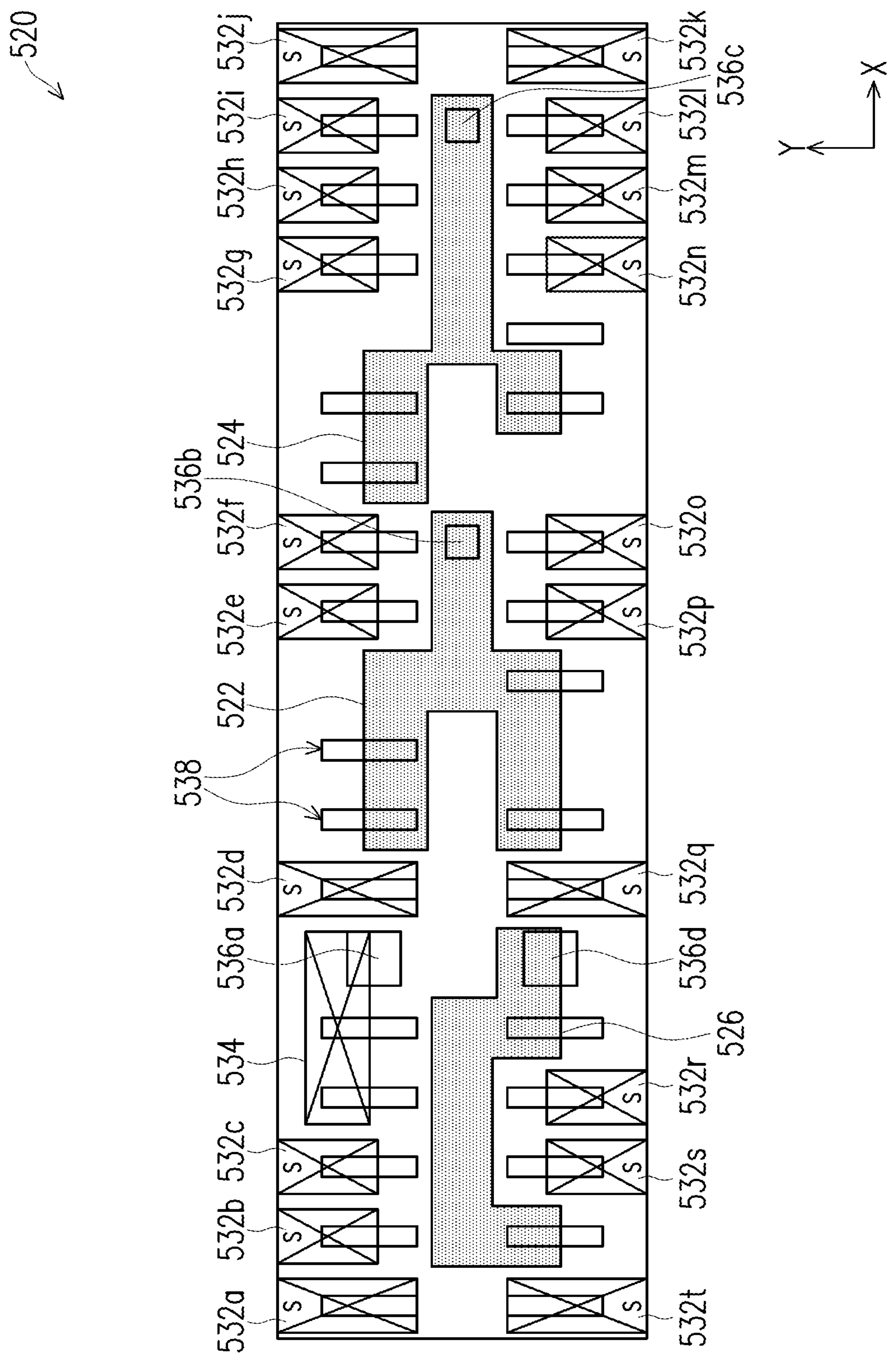
FIG. 27 is a diagram schematically illustrating the two fork-shaped backside contacts, the spoon-shaped backside contact, the pinned backside contacts, the backside contact, the deep via layers, and the OD regions of the flip-flop circuit of FIG. 26, in accordance with some embodiments.

FIG. 27 is a diagram schematically illustrating the two fork-shaped backside contacts 522 and 524, the spoon-shaped backside contact 526, the pinned backside contacts 532*a*-532*t*, the backside contact 534, the deep via layers 536*a*-536*d*, and OD regions 538, in accordance with some embodiments.

Advantages of the two fork-shaped backside contacts 522 and 524, the spoon-shaped backside contact 526, the pinned backside contacts 532*a*-532*t*, backside contact 534, and deep via layers 536*a*-536*d* include connecting signals at these contacts and layers instead of at frontside metal layers. This increases the flexibility of routing, reduces the area of the VFET device, increases gate density, and reduces metal layer coupling.

Figure 28:
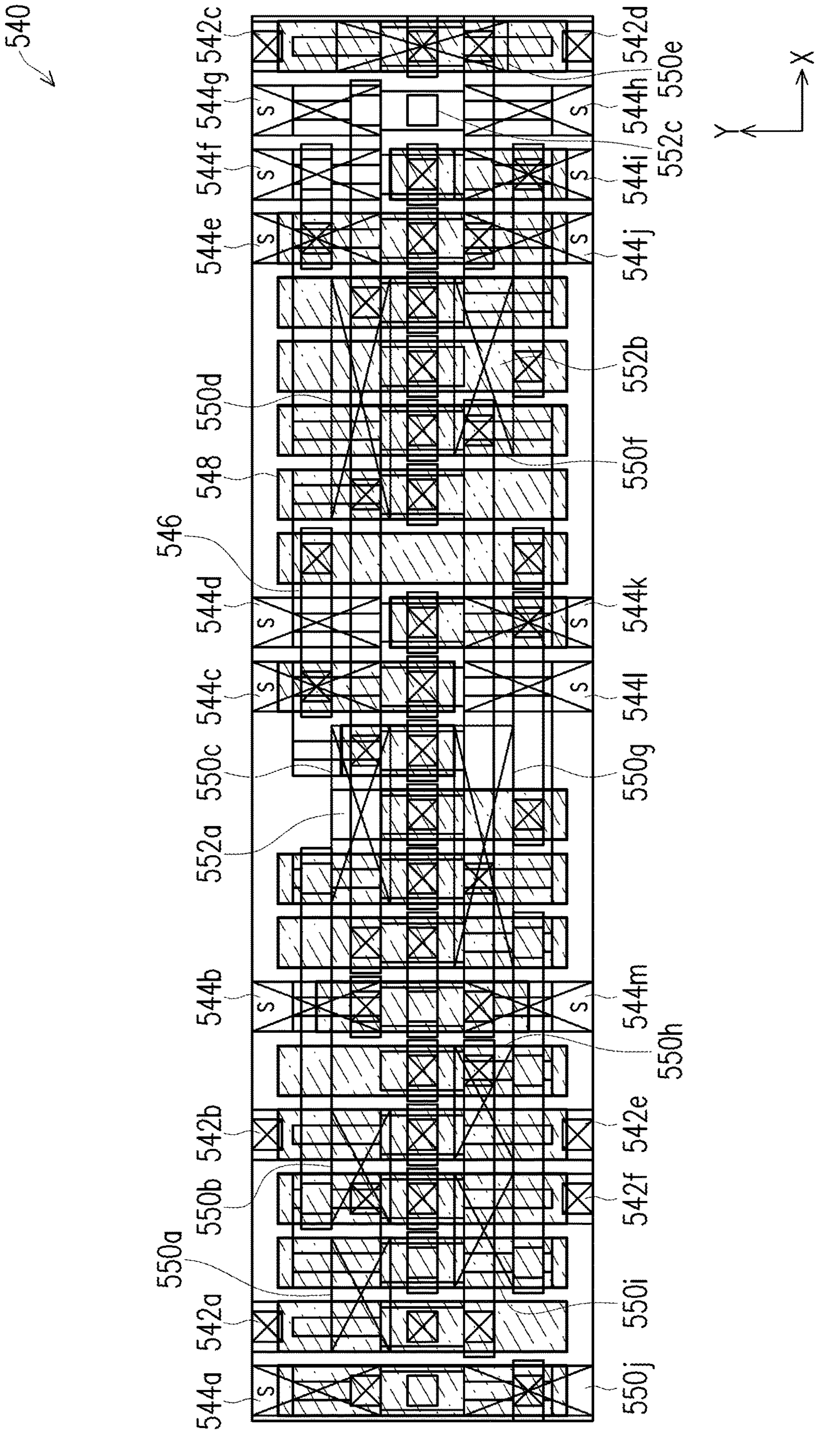
FIG. 28 is a diagram schematically illustrating a flip-flop circuit having frontside power contacts, pinned backside layers, backside contacts, and deep via layers, in accordance with some embodiments.

FIG. 28 is a diagram schematically illustrating a flip-flop circuit 540 having frontside power contacts 542*a*-542*f*, pinned backside layers 544*a*-544*m*, backside contacts 550*a*-550*j*, and deep via layers 552*a*-552*c*, in accordance with some embodiments. The flip-flop circuit 540 has a 22 CPP area with first metal layer M0 546 extending in the x-direction and second metal layer M1 548 extending in the y-direction.

Figure 29:
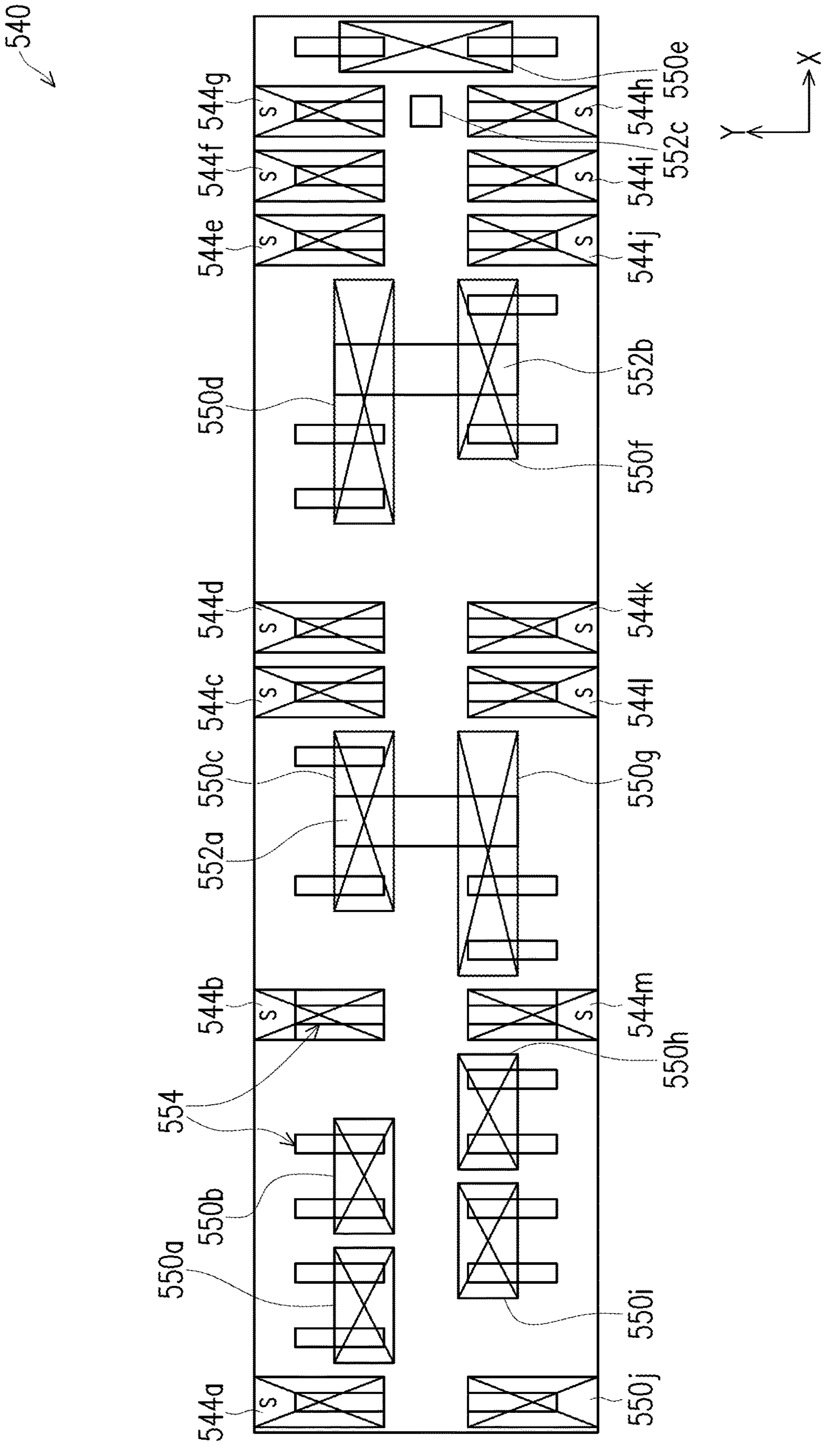
FIG. 29 is a diagram schematically illustrating the pinned backside layers, the backside contacts, the deep via layers, and the OD regions of the flip-flop circuit of FIG. 28, in accordance with some embodiments.

FIG. 29 is a diagram schematically illustrating the pinned backside layers 544*a*-544*m*, the backside contacts 550*a*-550*j*, the deep via layers 552*a*-552*c*, and OD regions 554, in accordance with some embodiments.

Advantages of the frontside power contacts 542*a*-542*f*, the pinned backside layers 544*a*-544*m*, the backside contacts 550*a*-550*j*, and the deep via layers 552*a*-552*c* include connecting signals at these contacts and layers instead of at frontside metal layers. This increases the flexibility of routing, reduces the area of the VFET device, increases gate density, and reduces metal layer coupling.

Figure 30:
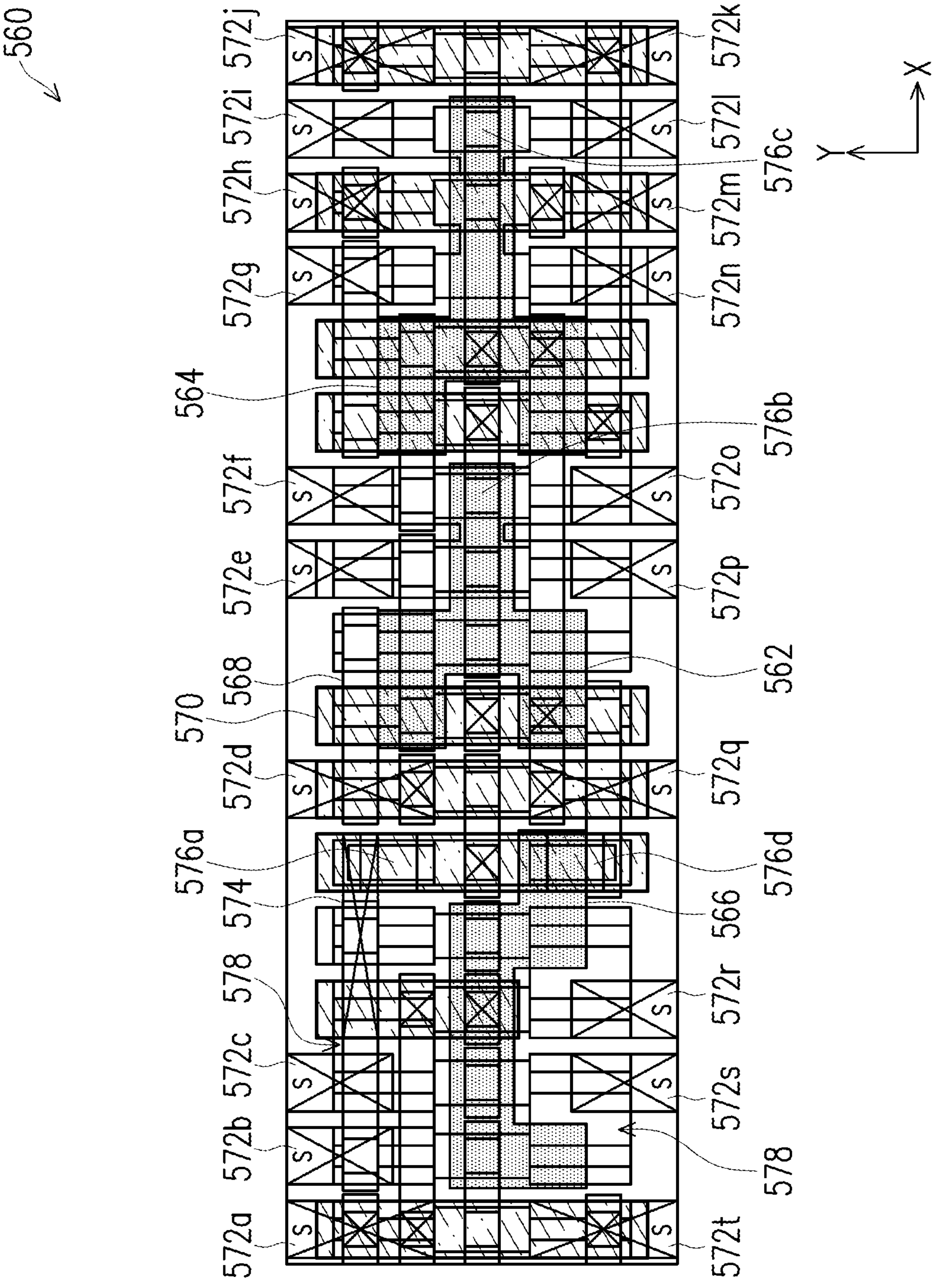
FIG. 30 is a diagram schematically illustrating a flip-flop circuit having two fork-shaped backside contacts and a spoon-shaped backside contact, in accordance with some embodiments.

FIG. 30 is a diagram schematically illustrating a flip-flop circuit 560 having two fork-shaped backside contacts 562 and 564 and a spoon-shaped backside contact 566, in accordance with some embodiments. The flip-flop circuit 560 has a 17 CPP area with first metal layer M0 568 extending in the x-direction and second metal layer M1 570 extending in the y-direction. Thus, the flip-flop circuit 560 with the two fork-shaped backside contacts 562 and 564 and the spoon-shaped backside contact 566 is smaller than the flip-flop circuit 540 of FIGS. 28 and 29. The flip-flop circuit 560 further includes pinned backside contacts 572*a*-572*t*, backside contact 574, deep via layers 576*a*-576*d*, and MD layers 578. In some embodiments, at least one of the fork-shaped backside contacts 562 and 564 is changed to a hammer-shaped backside contact.

Figure 31:
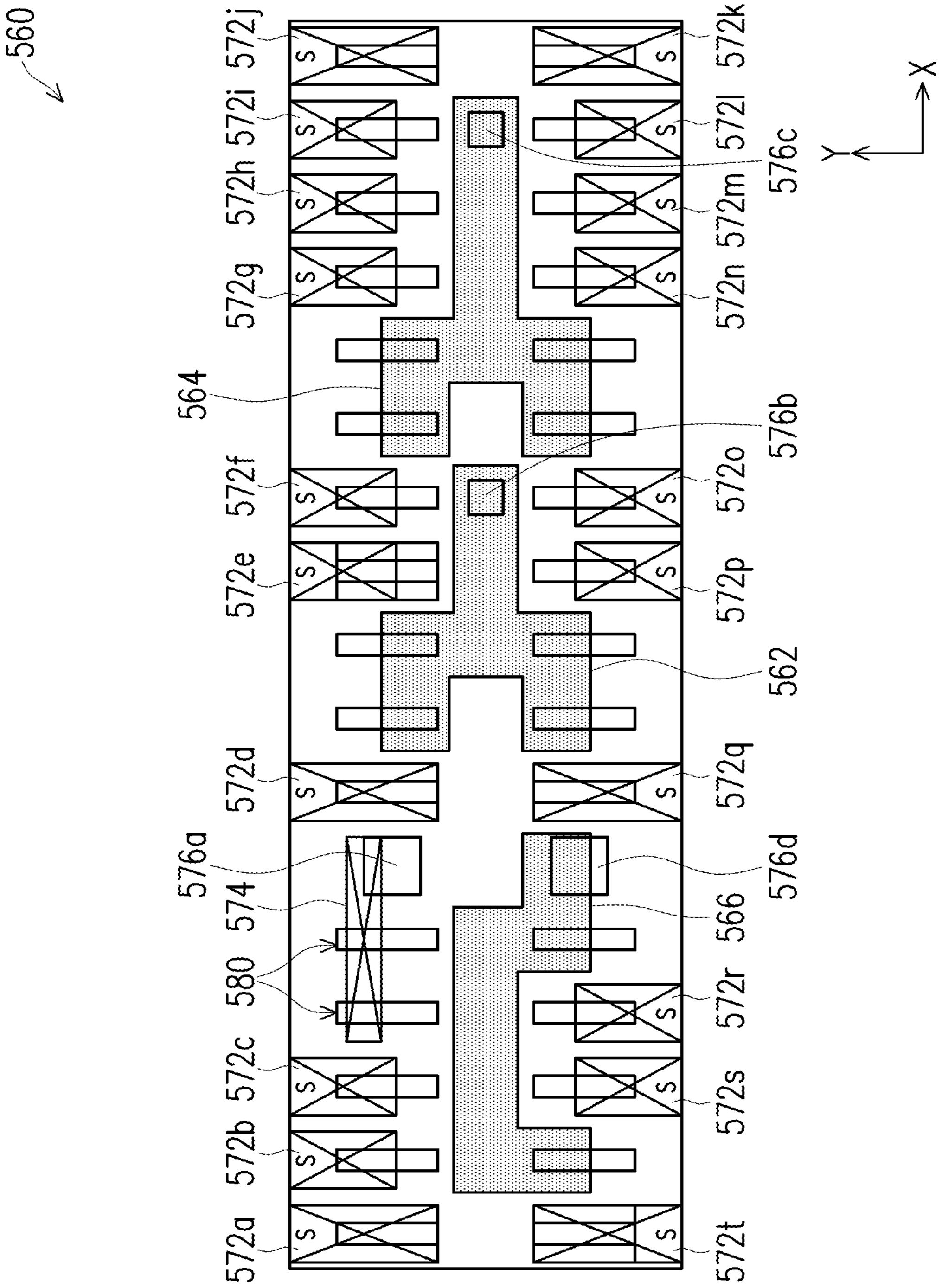
FIG. 31 is a diagram schematically illustrating the two fork-shaped backside contacts, the spoon-shaped backside contact, the pinned backside contacts, the backside contact, the deep via layers, and the OD regions of the flip-flop circuit of FIG. 30, in accordance with some embodiments.

FIG. 31 is a diagram schematically illustrating the two fork-shaped backside contacts 562 and 564, the spoon-shaped backside contact 566, the pinned backside contacts 572*a*-572*t*, the backside contact 574, the deep via layers 576*a*-576*d*, and OD regions 580, in accordance with some embodiments.

Advantages of the two fork-shaped backside contacts 562 and 564, the spoon-shaped backside contact 566, the pinned backside contacts 572*a*-572*t*, the backside contact 574, and the deep via layers 576*a*-576*d* include connecting signals at these contacts and layers instead of at frontside metal layers, which increases the flexibility of routing, reduces the area of the VFET device, increases gate density, and reduces metal layer coupling.

Figure 32:
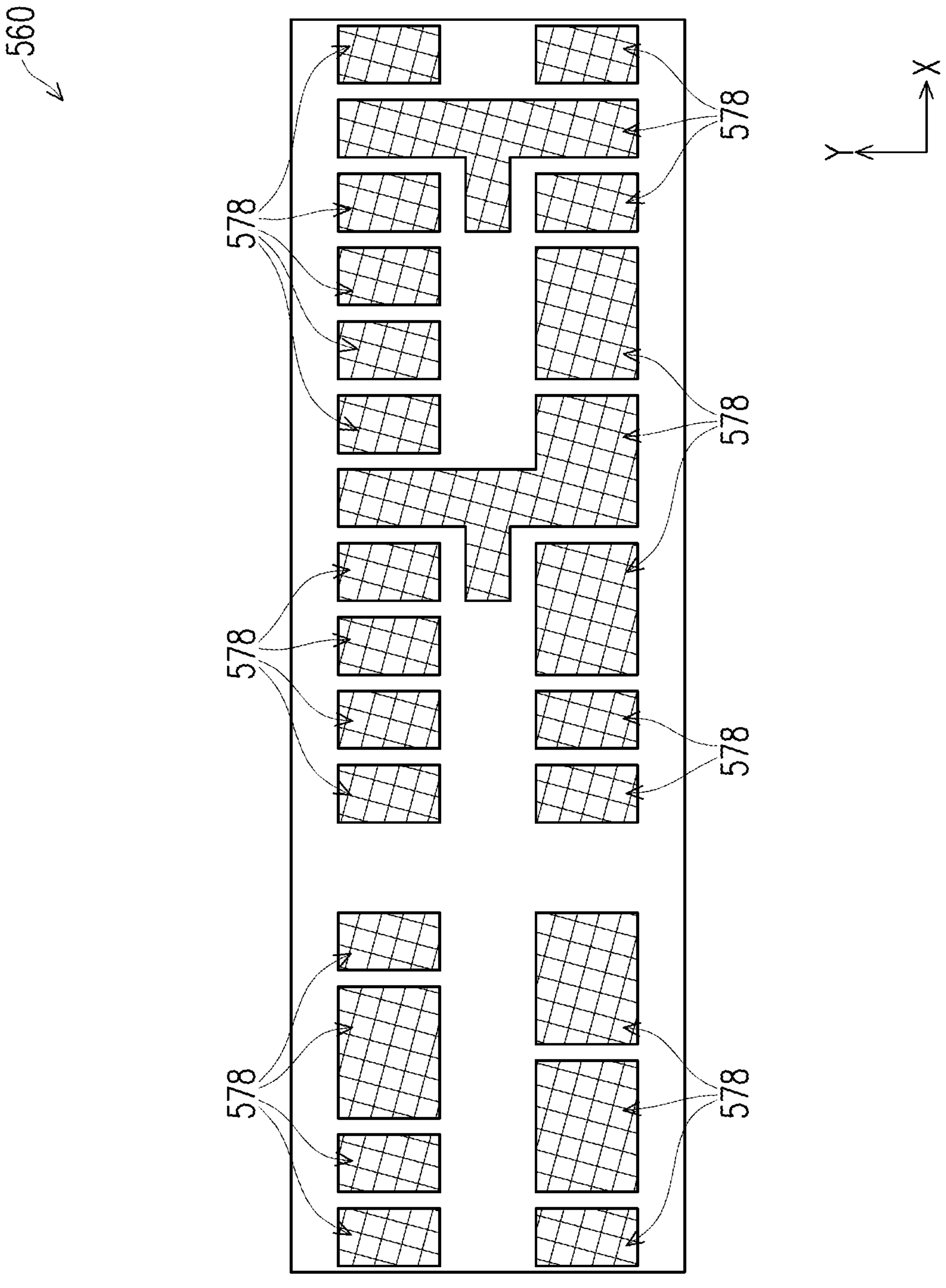
FIG. 32 is a diagram schematically illustrating the MD layers of the flip-flop circuit of FIG. 30, in accordance with some embodiments.

FIG. 32 is a diagram schematically illustrating the MD layers 578, in accordance with some embodiments. Advantages of the various shapes and connections of the MD layers 578 include connecting signals at these layers instead of at frontside metal layers. This increases the flexibility of routing, reduces the area of the VFET device, increases gate density, and reduces metal layer coupling.

Figure 33:
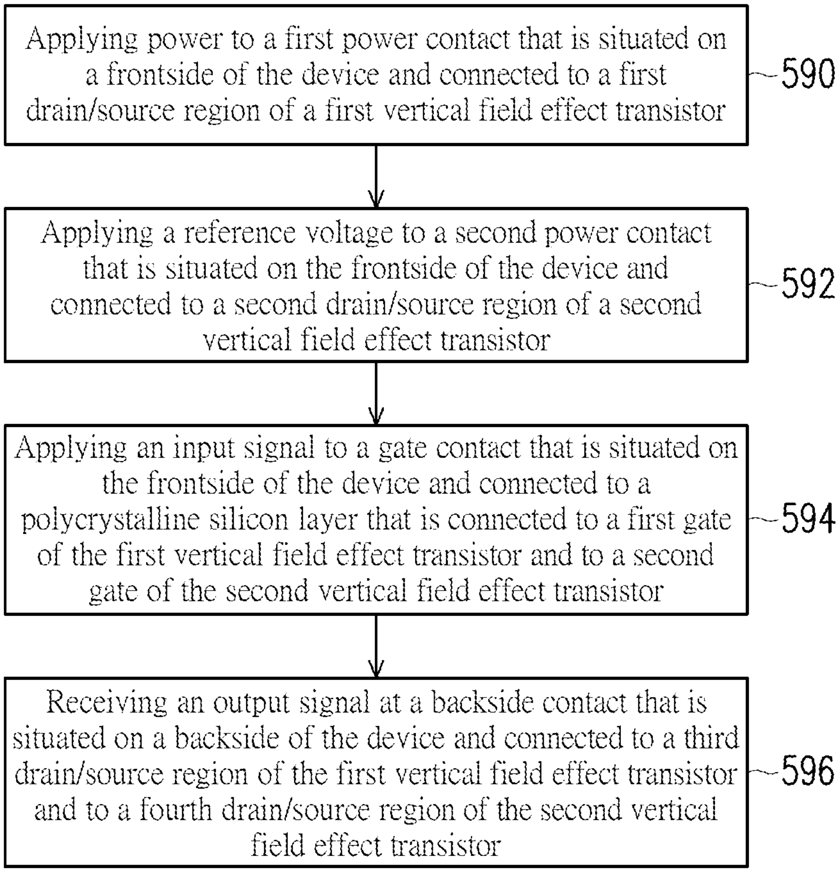
FIG. 33 is a diagram schematically illustrating a method of operating a device, in accordance with some embodiments.

FIG. 33 is a diagram schematically illustrating a method of operating a device, in accordance with some embodiments. The device can be any of the devices described in the present application. In some embodiments, the device is like VFET device 20 of FIG. 1. In some embodiments, the device is like VFET device 100 of FIG. 7.

At 590, the method includes applying power to a first power contact that is situated on a frontside of the device and connected to a first drain/source region of a first VFET. In some embodiments, the first VFET is like the first VFET 26, and the first power contact is like the frontside voltage contact 30. In some embodiments, the first VFET is like the first VFET 106, and the first power contact is like the frontside voltage contact 110. In some embodiments, applying power to the first power contact includes applying power to a first metal layer and a metal over diffusion layer that is connected to the first drain/source region of the first VFET.

At 592, the method includes applying a reference voltage to a second power contact that is situated on the frontside of the device and connected to a second drain/source region of a second VFET. In some embodiments, the second VFET is like the second VFET 28, and the second power contact is like the frontside reference contact 38. In some embodiments, the second VFET is like the second VFET 108, and the second power contact is like the frontside reference contact 116. In some embodiments, applying the reference voltage includes applying the reference voltage through a first metal layer and a metal over diffusion layer that is connected to the second drain/source region of the second vertical field effect transistor.

At 594, the method includes applying an input signal to a gate contact that is situated on the frontside of the device and connected to a polycrystalline silicon layer that is connected to a first gate of the first VFET and to a second gate of the second VFET. In some embodiments, the gate contact is like the frontside input contact 46, input pin I. In some embodiments, the gate contact is like the frontside input contact 122, input pin I.

At 596, the method includes receiving an output signal at a backside contact that is situated on a backside of the device and connected to a third drain/source region of the first VFET and to a fourth drain/source region of the second VFET. In some embodiments, the backside contact is like the backside contact 24. In some embodiments, the backside contact is like the backside contact 104. In some embodiments, receiving the output signal includes receiving the output signal at the frontside of the device through a filler configured to electrically connect the backside contact that is situated on the backside of the device to the frontside of the device.

Figure 34:
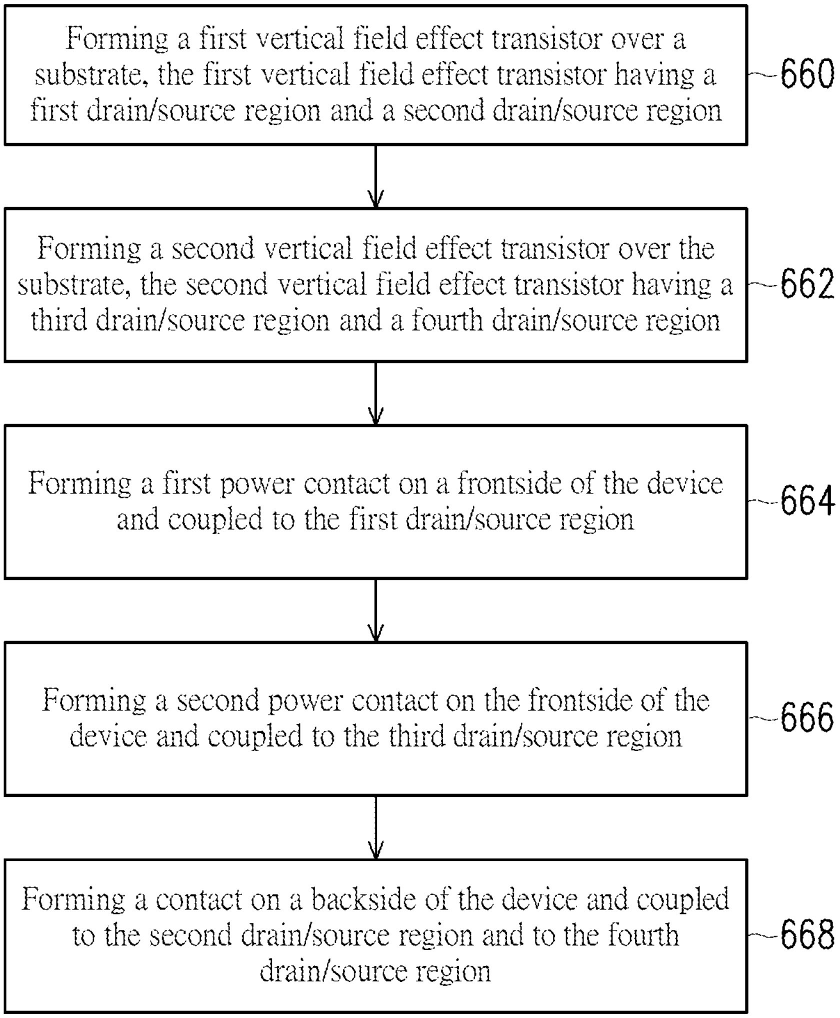
FIG. 34 is a diagram schematically illustrating a method of fabricating a device, in accordance with some embodiments.

FIG. 34 is a diagram schematically illustrating a method of fabricating a device, in accordance with some embodiments. The device can be any of the devices described in the present application. In some embodiments, the device is like VFET device 20 of FIG. 1. In some embodiments, the device is like VFET device 100 of FIG. 7.

At 660, the method includes forming a first VFET over a substrate, the first VFET having a first drain/source region and a second drain/source region and, at 662, the method includes forming a second VFET over the substrate, the second VFET having a third drain/source region and a fourth drain/source region.

At 664, the method includes forming a first power contact on a frontside of the device and coupled to the first drain/source region and, at 666, the method includes forming a second power contact on the frontside of the device and coupled to the third drain/source region. In some embodiments, forming the first power contact comprises forming a first metal over diffusion layer over the first drain/source region and electrically connected to the first drain/source region and forming a first metal layer portion over the first metal over diffusion layer and electrically connected to the first metal over diffusion layer. In some embodiments, forming the second power contact comprises forming a second metal over diffusion layer over the third drain/source region and electrically connected to the third drain/source region and forming another first metal layer portion over the second metal over diffusion layer and electrically connected to the second metal over diffusion layer.

At 668, the method includes forming a contact on a backside of the device and coupled to the second drain/source region and to the fourth drain/source region. In some embodiments, forming the contact comprises forming the contact to be directly connected to the second drain/source region and to the fourth drain/source region.

In some embodiments, the method includes forming a filler portion that electrically connects the contact to the frontside of the device, wherein forming the filler portion includes forming a deep via configured to be electrically connected to the contact and forming a polycrystalline silicon layer that is electrically connected to a frontside metal layer.

Figure 35:
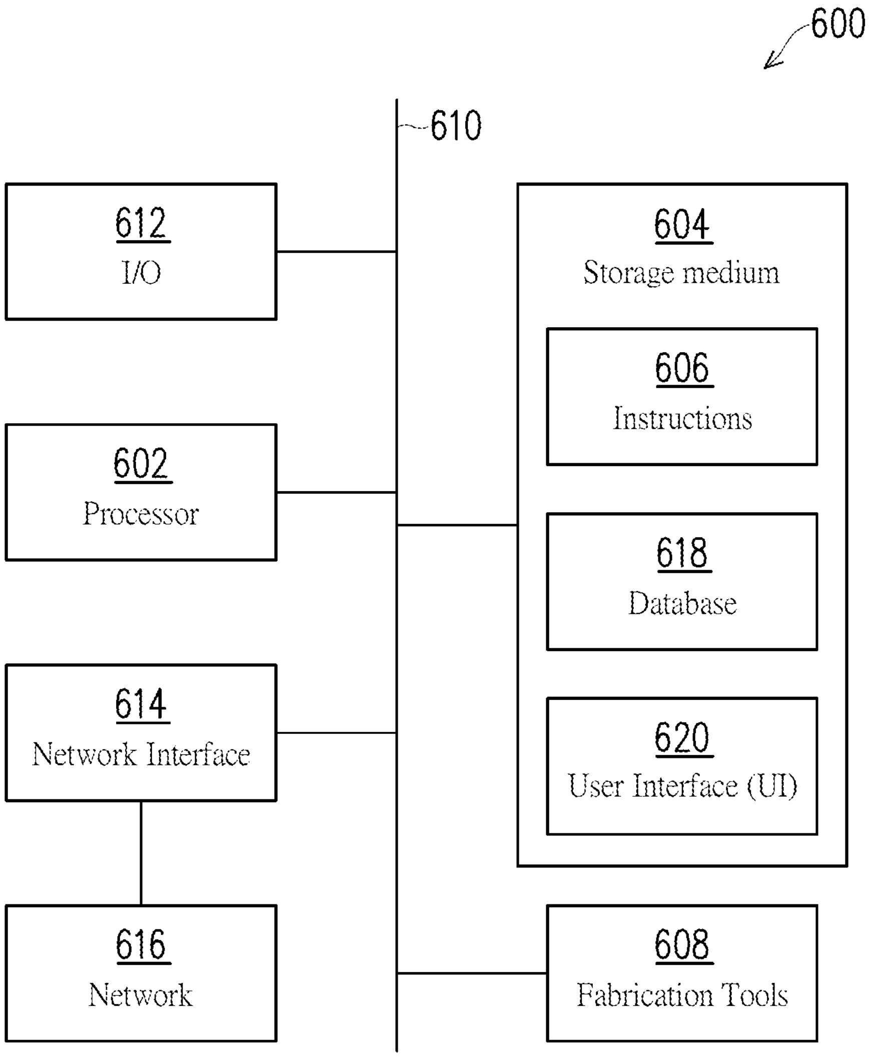
FIG. 35 is a block diagram schematically illustrating an example of a computer system configured to provide the semiconductor devices and methods of the current disclosure, in accordance with some embodiments.

FIG. 35 is a block diagram schematically illustrating an example of a computer system 600 configured to provide the semiconductor devices and methods of the current disclosure, in accordance with some embodiments. Some or all the design, layout, and manufacture of the semiconductor devices, also referred to as semiconductor circuits, can be performed by or with the computer system 600. In some embodiments, the computer system 600 includes an electronic design automation (EDA) system. In some embodiments, the semiconductor devices are ICs.

In some embodiments, the system 600 is a general-purpose computing device including a processor 602 and a non-transitory, computer-readable storage medium 604. The computer-readable storage medium 604 may be encoded with, e.g., store, computer program code such as executable instructions 606. Execution of the instructions 606 by the processor 602 provides (at least in part) a design tool that implements a portion or all the functions of the system 600, such as pre-layout simulations, post-layout simulations, routing, rerouting, and final layout for manufacturing. Further, fabrication tools 608 are included to further layout and physically implement the design and manufacture of the semiconductor devices. In some embodiments, execution of the instructions 606 by the processor 602 provides (at least in part) a design tool that implements a portion or all the functions of the system 600. In some embodiments, the system 600 includes a commercial router. In some embodiments, the system 600 includes an automatic place and route (APR) system.

The processor 602 is electrically coupled to the computer-readable storage medium 604 by a bus 610 and to an I/O interface 612 by the bus 610. A network interface 614 is also electrically connected to the processor 602 by the bus 610. The network interface 614 is connected to a network 616, so that the processor 602 and the computer-readable storage medium 604 can connect to external elements using the network 616. The processor 602 is configured to execute the computer program code or instructions 606 encoded in the computer-readable storage medium 604 to cause the system 600 to perform a portion or all the functions of the system 600, such as providing the semiconductor devices and methods of the current disclosure and other functions of the system 600. In some embodiments, the processor 602 is a central processing unit (CPU), a multi-processor, a distributed processing system, an application specific integrated circuit (ASIC), and/or a suitable processing unit.

In some embodiments, the computer-readable storage medium 604 is an electronic, magnetic, optical, electromagnetic, infrared, and/or semiconductor system or apparatus or device. For example, the computer-readable storage medium 604 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 604 can include a compact disk read only memory (CD-ROM), a compact disk read/write memory (CD-R/W), and/or a digital video disc (DVD).

In some embodiments, the computer-readable storage medium 604 stores computer program code or instructions 606 configured to cause the system 600 to perform a portion or all the functions of the system 600. In some embodiments, the computer-readable storage medium 604 also stores information which facilitates performing a portion or all the functions of the system 600. In some embodiments, the computer-readable storage medium 604 stores a database 618 that includes one or more of component libraries, digital circuit cell libraries, and databases.

The system 600 includes the I/O interface 612, which is coupled to external circuitry. In some embodiments, the I/O interface 612 includes a keyboard, keypad, mouse, trackball, trackpad, touchscreen, and/or cursor direction keys for communicating information and commands to the processor 602.

The network interface 614 is coupled to the processor 602 and allows the system 600 to communicate with the network 616, to which one or more other computer systems are connected. The network interface 614 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 600 can be performed in two or more systems that are like system 600.

The system 600 is configured to receive information through the I/O interface 612. The information received through the I/O interface 612 includes one or more of instructions, data, design rules, libraries of components and cells, and/or other parameters for processing by the processor 602. The information is transferred to the processor 602 by the bus 610. Also, the system 600 is configured to receive information related to a user interface (UI) through the I/O interface 612. This UI information can be stored in the computer-readable storage medium 604 as a UI 620.

In some embodiments, a portion or all the functions of the system 600 are implemented via a standalone software application for execution by a processor. In some embodiments, a portion or all the functions of the system 600 are implemented in a software application that is a part of an additional software application. In some embodiments, a portion or all the functions of the system 600 are implemented as a plug-in to a software application. In some embodiments, at least one of the functions of the system 600 is implemented as a software application that is a portion of an EDA tool. In some embodiments, a portion or all the functions of the system 600 are implemented as a software application that is used by the system 600. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 600 include fabrication tools 608 for implementing the manufacturing processes of the system 600. For example, based on the final layout, photolithographic masks may be generated, which are used to fabricate the semiconductor device by the fabrication tools 608.

Figure 36:
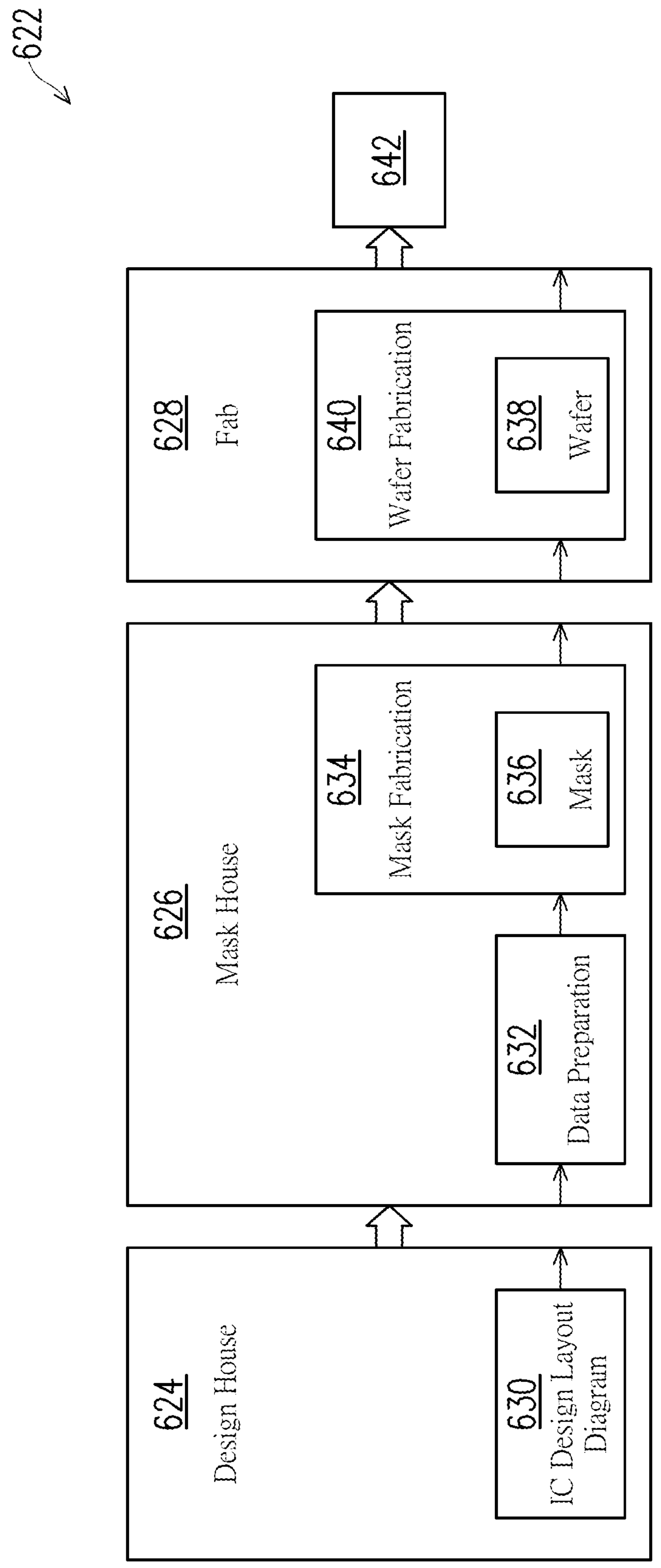
FIG. 36 is a block diagram of a semiconductor device manufacturing system and a semiconductor device manufacturing flow associated therewith, in accordance with some embodiments.

Further aspects of device fabrication are disclosed in conjunction with FIG. 36, which is a block diagram of a semiconductor device manufacturing system 622 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 622.

In FIG. 36, the semiconductor device manufacturing system 622 includes entities, such as a design house 624, a mask house 626, and a semiconductor device manufacturer/fabricator ("Fab") 628, that interact with one another in the design, development, and manufacturing cycles and/or services related to manufacturing a semiconductor device, such as the semiconductor devices described herein. The entities in the system 622 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 624, the mask house 626, and the semiconductor device fab 628 are owned by a single larger company. In some embodiments, two or more of the design house 624, the mask house 626, and the semiconductor device fab 628 coexist in a common facility and use common resources.

The design house (or design team) 624 generates a semiconductor device design layout diagram 630. The semiconductor device design layout diagram 630 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 630 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 624 implements a design procedure to form a semiconductor device design layout diagram 630. The semiconductor device design layout diagram 630 is presented in one or more data files having information of the geometrical patterns. For example, semiconductor device design layout diagram 630 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 626 includes data preparation 632 and mask fabrication 634. The mask house 626 uses the semiconductor device design layout diagram 630 to manufacture one or more masks 636 to be used for fabricating the various layers of the semiconductor device or semiconductor structure. The mask house 626 performs mask data preparation 632, where the semiconductor device design layout diagram 630 is translated into a representative data file (RDF). The mask data preparation 632 provides the RDF to the mask fabrication 634. The mask fabrication 634 includes a mask writer that converts the RDF to an image on a substrate, such as a mask (reticle) 636 or a semiconductor wafer 638. The design layout diagram 630 is manipulated by the mask data preparation 632 to comply with characteristics of the mask writer and/or criteria of the semiconductor device fab 628. In FIG. 36, the mask data preparation 632 and the mask fabrication 634 are illustrated as separate elements. In some embodiments, the mask data preparation 632 and the mask fabrication 634 can be collectively referred to as mask data preparation.

In some embodiments, the mask data preparation 632 includes an optical proximity correction (OPC) which uses lithography enhancement techniques to compensate for image errors, such as those that can arise from diffraction, interference, other process effects and the like. The OPC adjusts the semiconductor device design layout diagram 630. In some embodiments, the mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 632 includes a mask rule checker (MRC) that checks the semiconductor device design layout diagram 630 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 630 to compensate for limitations during the mask fabrication 634, which may undo part of the modifications performed by OPC to meet mask creation rules.

In some embodiments, the mask data preparation 632 includes lithography process checking (LPC) that simulates processing that will be implemented by the semiconductor device fab 628. LPC simulates this processing based on the semiconductor device design layout diagram 630 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the semiconductor device design layout diagram 630.

The above description of mask data preparation 632 has been simplified for the purposes of clarity. In some embodiments, data preparation 632 includes additional features such as a logic operation (LOP) to modify the semiconductor device design layout diagram 630 according to manufacturing rules. Additionally, the processes applied to the semiconductor device design layout diagram 630 during data preparation 632 may be executed in a variety of different orders.

After the mask data preparation 632 and during the mask fabrication 634, a mask 636 or a group of masks 636 are fabricated based on the modified semiconductor device design layout diagram 630. In some embodiments, the mask fabrication 634 includes performing one or more lithographic exposures based on the semiconductor device design layout diagram 630. In some embodiments, an electron-beam (e-beam) or a mechanism of multiple e-beams is used to form a pattern on a mask (photomask or reticle) 636 based on the modified semiconductor device design layout diagram 630. The mask 636 can be formed in various technologies. In some embodiments, the mask 636 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 636 includes a transparent substrate (e.g., fused quartz) and an opaque material (e.g., chromium) coated in the opaque regions of the binary mask. In another example, the mask 636 is formed using a phase shift technology. In a phase shift mask (PSM) version of the mask 636, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 634 is used in a variety of processes. For example, such a mask(s) is used in an ion implantation process to form various doped regions in the semiconductor wafer 638, in an etching process to form various etching regions in the semiconductor wafer 638, and/or in other suitable processes.

The semiconductor device fab 628 includes wafer fabrication 640. The semiconductor device fab 628 is a semiconductor device fabrication business that includes one or more manufacturing facilities for the fabrication of a variety of different semiconductor device products. In some embodiments, the semiconductor device fab 628 is a semiconductor foundry. For example, there may be a manufacturing facility for the front end of line (FEOL) fabrication of a plurality of semiconductor device products, while a second manufacturing facility may provide the back end of line (BEOL) fabrication for the interconnection and packaging of the semiconductor device products, and a third manufacturing facility may provide other services for the foundry business.

The semiconductor device fab 628 uses the mask(s) 636 fabricated by the mask house 626 to fabricate the semiconductor structures or semiconductor devices 642 of the current disclosure. Thus, the semiconductor device fab 628 at least indirectly uses the semiconductor device design layout diagram 630 to fabricate the semiconductor structures or semiconductor devices 642 of the current disclosure. Also, the semiconductor wafer 638 includes a silicon substrate or other proper substrate having material layers formed thereon, and the semiconductor wafer 638 further includes one or more of various doped regions, dielectric features, multilevel interconnects, and the like (formed at subsequent manufacturing steps). In some embodiments, the semiconductor wafer 638 is fabricated by the semiconductor device fab 628 using the mask(s) 636 to form the semiconductor structures or semiconductor devices 642 of the current disclosure. In some embodiments, the semiconductor device fabrication includes performing one or more lithographic exposures based at least indirectly on the semiconductor device design layout diagram 630.

Disclosed embodiments of the present application provide VFET devices that include layouts and structures for reducing the area of the VFET devices. The layouts and structures include frontside power contacts, backside contacts, two-dimensional shapes of the backside contacts, and two-dimensional shapes of MD layers. In some embodiments, the frontside power contacts include power voltage contacts and/or power reference contacts, such as ground. In some embodiments, at least one of the backside contacts is connected to the frontside of the device using a filler structure that extends between the backside contact and the frontside metal layers of the VFET device.

In some embodiments, a VFET device includes a first VFET having a first drain/source region and a second drain/source region, and a second VFET having a third drain/source region and a fourth drain/source region. The VFET device includes a first power contact, such as a power voltage contact, situated on a frontside of the device and coupled to the first drain/source region and a second power contact, such as a reference contact, situated on the frontside of the device and coupled to the third drain/source region. The VFET device further includes a backside contact situated on a backside of the device and coupled to the second drain/source region and to the fourth drain/source region. In some embodiments, the two-dimensional backside contacts and/or the two-dimensional MD layers connect multiple transistors, such as VFETs, together.

In accordance with some embodiments, a device includes a first VFET having a first drain/source region and a second drain/source region, and a second VFET having a third drain/source region and a fourth drain/source region. The device includes a first power contact situated on a frontside of the device and coupled to the first drain/source region, a second power contact situated on the frontside of the device and coupled to the third drain/source region, and a contact situated on a backside of the device and coupled to the second drain/source region and to the fourth drain/source region.

In accordance with further embodiments, a device includes a first VFET having a first drain/source region and a second drain/source region, and a second VFET having a third drain/source region and a fourth drain/source region. The device includes a first power contact situated on a frontside of the device and connected to a first frontside metal layer portion that is connected to a first MD layer portion that is connected to the first drain/source region, and a backside contact situated on a backside of the device and directly connected to the second drain/source region and the fourth drain/source region.

In accordance with still further disclosed aspects, a method of fabricating a device includes forming a first vertical field effect transistor over a substrate, the first vertical field effect transistor having a first drain/source region and a second drain/source region; forming a second vertical field effect transistor over the substrate, the second vertical field effect transistor having a third drain/source region and a fourth drain/source region; forming a first power contact on a frontside of the device and coupled to the first drain/source region; forming a second power contact on the frontside of the device and coupled to the third drain/source region; and forming a contact on a backside of the device and coupled to the second drain/source region and to the fourth drain/source region.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first vertical field effect transistor having a first drain/source region on a frontside of the device and a second drain/source region on a backside of the device;

a second vertical field effect transistor having a third drain/source region on the frontside of the device and a fourth drain/source region on the backside of the device;

a first power contact situated on the frontside of the device and electrically connected to the first drain/source region through a first metal over diffusion layer contact on the first drain/source region;

a second power contact situated on the frontside of the device and electrically connected to the third drain/source region through a second metal over diffusion layer contact on the third drain/source region; and a contact situated on the backside of the device and connected to each of the second drain/source region and the fourth drain/source region.

2. The device of claim 1, wherein the first power contact is electrically connected through a first metal layer contact and the first metal over diffusion layer contact to the first drain/source region.

3. The device of claim 2, wherein the first metal over diffusion layer contact is L shaped, H shaped, I shaped, Z shaped, P shaped, F shaped, U shaped, T shaped, or four shaped.

4. The device of claim 1, wherein the second power contact is electrically coupled through a second metal layer contact and the second metal over diffusion layer to the third drain/source region.

5. The device of claim 1, wherein the contact is directly connected to the second drain/source region and to the fourth drain/source region.

6. The device of claim 1, comprising a gate contact situated on the frontside of the device and coupled to gate material that is connected to a first gate of the first vertical field effect transistor and to a second gate of the second vertical field effect transistor.

7. The device of claim 1, comprising a filler portion configured to electrically connect the contact situated on the backside of the device to the frontside of the device.

8. The device of claim 7, wherein the filler portion includes a deep via electrically connected to the contact and to gate material that is coupled to a frontside metal layer.

9. The device of claim 1, wherein the contact is L shaped, H shaped, I shaped, Z shaped, P shaped, F shaped, U shaped, or T shaped.

10. The device of claim 1, wherein the contact is fork shaped, hammer shaped, or spoon shaped.

11. A device, comprising:

a first vertical field effect transistor having a first drain/source region on a frontside of the device and a second drain/source region on a backside of the device;

a second vertical field effect transistor having a third drain/source region on the frontside of the device and a fourth drain/source region on the backside of the device;

a first power contact situated on the frontside of the device and directly connected to a first frontside metal layer contact that is directly connected to a first metal over diffusion layer contact that is directly connected to the first drain/source region; and a backside contact situated on the backside of the device and directly connected to the second drain/source region and the fourth drain/source region.

12. The device of claim 11, comprising a second power contact situated on the frontside of the device and connected to the third drain/source region.

13. The device of claim 12, wherein the second power contact is directly connected to a second frontside metal layer contact that is directly connected to a second metal over diffusion layer contact that is directly connected to the third drain/source region.

14. The device of claim 11, comprising a gate contact situated on the frontside of the device and connected to gate material that is connected to a first gate of the first vertical field effect transistor and to a second gate of the second vertical field effect transistor.

15. The device of claim 11, comprising a filler configured to electrically connect the backside contact situated on the backside of the device to the frontside of the device.

16. The device of claim 15, wherein the filler includes a deep via electrically connected to the backside contact and gate material that is connected to a second frontside metal layer contact.

17. A method of fabricating a device, the method comprising:

forming a first vertical field effect transistor over a substrate, the first vertical field effect transistor having a first drain/source region on a frontside of the device and a second drain/source region on a backside of the device;

forming a second vertical field effect transistor over the substrate, the second vertical field effect transistor having a third drain/source region on the frontside of the device and a fourth drain/source region on the backside of the device;

forming a first power contact on the frontside of the device and electrically connected to the first drain/source region through a first metal over diffusion layer contact on the first drain/source region;

forming a second power contact on the frontside of the device and electrically connected to the third drain/source region through a second metal over diffusion layer contact on the third drain/source region; and forming a contact on the backside of the device and connected to each of the second drain/source region and the fourth drain/source region.

18. The method of claim 17, wherein forming a first power contact comprises forming the first metal over diffusion layer contact over the first drain/source region and electrically connected to the first drain/source region and forming a first metal layer contact over the first metal over diffusion layer contact and electrically connected to the first metal over diffusion layer contact, and forming a second power contact comprises forming a second metal over diffusion layer contact over the third drain/source region and electrically connected to the third drain/source region and forming a second metal layer contact over the second metal over diffusion layer contact and electrically connected to the second metal over diffusion layer contact.

19. The method of claim 17, wherein forming the contact comprises forming the contact to be directly connected to the second drain/source region and to the fourth drain/source region.

20. The method of claim 17, comprising forming a filler portion that electrically connects the contact to the frontside of the device, wherein forming the filler portion includes forming a deep via configured to be electrically connected to the contact and forming gate material that is electrically connected to a frontside metal layer.

* * * * *